(12) United States Patent
Hughley et al.

(10) Patent No.: US 11,662,115 B2
(45) Date of Patent: May 30, 2023

(54) HIERARCHY MODEL BUILDER FOR BUILDING A HIERARCHICAL MODEL OF CONTROL ASSETS

(71) Applicant: Honeywell International Inc., Charlotte, NC (US)

(72) Inventors: Bill Hughley, Atlanta, GA (US); Mayur Sidram Salgar, Bangalore (IN); Sheeladitya Karmakar, Dunwood, GA (US); Somnath Ghosh, Cumming, GA (US); Shahajahan Sheikh, Bengaluru (IN)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 0 days.

(21) Appl. No.: 17/187,361

(22) Filed: Feb. 26, 2021

(65) Prior Publication Data

US 2022/0275959 A1 Sep. 1, 2022

(51) Int. Cl.
*G06F 30/13* (2020.01)
*G06F 3/0482* (2013.01)
(Continued)

(52) U.S. Cl.
CPC .............. *F24F 11/63* (2018.01); *G05B 15/02* (2013.01); *G06F 3/0482* (2013.01);
(Continued)

(58) Field of Classification Search
CPC ........ F24F 11/63; G05B 15/02; G06F 3/0482; G06F 3/04847; G06F 3/0486; G06F 30/13
See application file for complete search history.

(56) References Cited

U.S. PATENT DOCUMENTS

| 191,512 A | 6/1877 | Bennett et al. |
|---|---|---|
| 4,009,647 A | 3/1977 | Howorth |

(Continued)

FOREIGN PATENT DOCUMENTS

| CA | 2387100 A1 | 11/2003 |
|---|---|---|
| CA | 2538139 A1 | 3/2005 |

(Continued)

OTHER PUBLICATIONS

Honeywell, "Energy Manager User Guide," Release 3.2, 180 pages, 2008.

(Continued)

*Primary Examiner* — Jennifer N Welch
*Assistant Examiner* — Ashley M Fortino
(74) *Attorney, Agent, or Firm* — Seager, Tufte & Wickhem, LLP

(57) ABSTRACT

A spatial hierarchical model is built by accepting user input to add and name each of one or more first level spaces at a first level of the spatial hierarchical model and to select a selected one of the first level spaces of the spatial hierarchical model and add and name each of one or more child level spaces that are spatially part of the selected first level space at a second level of the spatial hierarchical model. A graphical representation of one or more of the first level spaces and one or more corresponding child level spaces is displayed along with a listing of at least some of the plurality of building control assets. User input is accepted to assign selected building control assets from the listing of at least some of the plurality of building control assets to a selected child level space.

15 Claims, 28 Drawing Sheets

(51) Int. Cl.
*G06F 3/04847* (2022.01)
*G06F 3/0486* (2013.01)
*G05B 15/02* (2006.01)
*F24F 11/63* (2018.01)

(52) U.S. Cl.
CPC ........ *G06F 3/0486* (2013.01); *G06F 3/04847*
(2013.01); *G06F 30/13* (2020.01)

(56) References Cited

U.S. PATENT DOCUMENTS

| | | | |
|---|---|---|---|
| 4,375,637 A | 3/1983 | Desjardins | |
| 4,918,615 A | 4/1990 | Suzuki et al. | |
| 4,939,922 A | 7/1990 | Smalley et al. | |
| 5,566,084 A | 10/1996 | Cmar | |
| 5,727,579 A | 3/1998 | Chardack | |
| 5,745,126 A | 4/1998 | Jain et al. | |
| 5,751,916 A | 5/1998 | Kon et al. | |
| 5,777,598 A | 7/1998 | Gowda et al. | |
| 5,973,662 A | 10/1999 | Singers et al. | |
| 6,065,842 A | 5/2000 | Fink | |
| 6,139,177 A | 10/2000 | Venkatraman et al. | |
| 6,144,993 A | 11/2000 | Fukunaga et al. | |
| 6,157,943 A | 12/2000 | Meyer | |
| 6,229,429 B1 | 5/2001 | Horon | |
| 6,238,337 B1 | 5/2001 | Kambhatla et al. | |
| 6,334,211 B1 | 12/2001 | Kojima et al. | |
| 6,353,853 B1 | 3/2002 | Gravlin | |
| 6,369,695 B2 | 4/2002 | Horon | |
| 6,375,038 B1 | 4/2002 | Daansen et al. | |
| 6,429,868 B1 | 8/2002 | Dehner, Jr. et al. | |
| 6,473,084 B1 | 10/2002 | Phillips et al. | |
| 6,487,457 B1 | 11/2002 | Hull et al. | |
| 6,580,950 B1 | 6/2003 | Johnson et al. | |
| 6,598,056 B1 | 7/2003 | Hull et al. | |
| 6,619,555 B2 | 9/2003 | Rosen | |
| 6,704,012 B1 | 3/2004 | Lefave | |
| 6,720,874 B2 | 4/2004 | Fufido et al. | |
| 6,741,915 B2 | 5/2004 | Poth | |
| 6,796,896 B2 | 9/2004 | Laiti | |
| 6,801,199 B1 | 10/2004 | Wallman | |
| 6,816,878 B1 | 11/2004 | Zimmers et al. | |
| 6,876,951 B2 | 4/2005 | Skidmore et al. | |
| 6,882,278 B2 | 4/2005 | Winings et al. | |
| 6,904,385 B1 | 6/2005 | Budike, Jr. | |
| 6,907,387 B1 | 6/2005 | Reardon | |
| 6,911,177 B2 | 6/2005 | Deal | |
| 6,993,403 B1 | 1/2006 | Dadebo et al. | |
| 6,993,417 B2 | 1/2006 | Osann, Jr. | |
| 7,023,440 B1 | 4/2006 | Havekost et al. | |
| 7,031,880 B1 | 4/2006 | Seem et al. | |
| 7,062,722 B1 | 6/2006 | Carlin et al. | |
| 7,110,843 B2 | 9/2006 | Pagnano et al. | |
| 7,139,685 B2 | 11/2006 | Bascle et al. | |
| 7,164,972 B2 | 1/2007 | Imhof et al. | |
| 7,183,899 B2 | 2/2007 | Behnke | |
| 7,200,639 B1 | 4/2007 | Koshida | |
| 7,222,111 B1 | 5/2007 | Budike, Jr. | |
| 7,222,800 B2 | 5/2007 | Wruck | |
| 7,257,397 B2 | 8/2007 | Shamoon et al. | |
| D552,116 S | 10/2007 | Kurian et al. | |
| 7,280,030 B1 | 10/2007 | Monaco | |
| 7,287,029 B1 * | 10/2007 | Craft | G06F 16/907 |
| 7,292,908 B2 | 11/2007 | Borne et al. | |
| 7,295,116 B2 | 11/2007 | Kumar et al. | |
| 7,302,313 B2 | 11/2007 | Sharp et al. | |
| 7,308,323 B2 | 12/2007 | Kruk et al. | |
| 7,308,388 B2 | 12/2007 | Beverina et al. | |
| 7,313,447 B2 | 12/2007 | Hsiung et al. | |
| 7,346,433 B2 | 3/2008 | Budike, Jr. | |
| 7,356,548 B1 | 4/2008 | Culp et al. | |
| 7,379,782 B1 | 5/2008 | Cocco | |
| 7,383,148 B2 | 6/2008 | Ahmed | |
| 7,434,742 B2 | 10/2008 | Mueller et al. | |
| 7,447,333 B1 | 11/2008 | Masticola et al. | |
| 7,466,224 B2 | 12/2008 | Ward et al. | |
| 7,496,472 B2 | 2/2009 | Seem | |
| 7,512,450 B2 | 3/2009 | Ahmed | |
| 7,516,490 B2 | 4/2009 | Riordan et al. | |
| 7,548,833 B2 | 6/2009 | Ahmed | |
| 7,551,092 B1 | 6/2009 | Henry | |
| 7,557,729 B2 | 7/2009 | Hubbard et al. | |
| 7,567,844 B2 | 7/2009 | Thomas et al. | |
| 7,596,473 B2 | 9/2009 | Hansen et al. | |
| 7,610,910 B2 | 11/2009 | Ahmed | |
| 7,626,507 B2 | 12/2009 | LaCasse | |
| 7,664,574 B2 | 2/2010 | Imhof et al. | |
| 7,682,464 B2 | 3/2010 | Glenn et al. | |
| 7,702,421 B2 | 4/2010 | Sullivan et al. | |
| 7,729,882 B2 | 6/2010 | Seem | |
| 7,755,494 B2 | 7/2010 | Melker et al. | |
| 7,761,310 B2 | 7/2010 | Rodgers | |
| 7,774,227 B2 | 8/2010 | Srivastava | |
| 7,797,188 B2 | 9/2010 | Srivastava | |
| 7,819,136 B1 | 10/2010 | Eddy | |
| 7,822,806 B2 | 10/2010 | Frank et al. | |
| 7,856,370 B2 | 12/2010 | Katta et al. | |
| D640,264 S | 6/2011 | Fujii et al. | |
| 7,978,083 B2 | 7/2011 | Melker et al. | |
| 7,984,384 B2 | 7/2011 | Chaudhri et al. | |
| 7,986,323 B2 | 7/2011 | Kobayashi et al. | |
| 8,024,666 B2 | 9/2011 | Thompson | |
| 8,086,047 B2 | 12/2011 | Penke et al. | |
| 8,099,178 B2 | 1/2012 | Mairs et al. | |
| 8,151,280 B2 | 4/2012 | Sather et al. | |
| 8,176,095 B2 | 5/2012 | Murray et al. | |
| 8,218,871 B2 | 7/2012 | Angell et al. | |
| 8,219,660 B2 | 7/2012 | McCoy et al. | |
| 8,271,941 B2 | 9/2012 | Zhang et al. | |
| 8,294,585 B2 | 10/2012 | Barnhill | |
| 8,302,020 B2 | 10/2012 | Louch et al. | |
| 8,320,634 B2 | 11/2012 | Deutsch | |
| 8,334,422 B2 | 12/2012 | Gutsol et al. | |
| 8,344,893 B1 | 1/2013 | Drammeh | |
| 8,375,118 B2 | 2/2013 | Hao et al. | |
| 8,476,590 B2 | 7/2013 | Stratmann et al. | |
| 8,516,016 B2 | 8/2013 | Park et al. | |
| 8,558,660 B2 | 10/2013 | Nix et al. | |
| 8,639,527 B2 | 1/2014 | Rensvold et al. | |
| 8,698,637 B2 | 4/2014 | Raichman | |
| 8,816,860 B2 | 8/2014 | Ophardt et al. | |
| 8,869,027 B2 | 10/2014 | Louch et al. | |
| 8,904,497 B2 | 12/2014 | Hsieh | |
| 8,936,944 B2 | 1/2015 | Peltz et al. | |
| 8,947,437 B2 | 2/2015 | Garr et al. | |
| 8,950,019 B2 | 2/2015 | Loberger et al. | |
| 9,000,926 B2 | 4/2015 | Hollock et al. | |
| 9,030,325 B2 | 5/2015 | Taneff | |
| 9,098,738 B2 | 8/2015 | Bilet et al. | |
| 9,105,071 B2 | 8/2015 | Fletcher et al. | |
| 9,175,356 B2 | 11/2015 | Peltz et al. | |
| 9,240,111 B2 | 1/2016 | Scott et al. | |
| 9,280,884 B1 | 3/2016 | Schultz et al. | |
| 9,292,972 B2 | 3/2016 | Hailemariam et al. | |
| 9,320,662 B2 | 4/2016 | Hayes et al. | |
| D760,237 S | 6/2016 | Sabadosh et al. | |
| 9,370,600 B1 | 6/2016 | DuPuis et al. | |
| 9,373,242 B1 | 6/2016 | Conrad et al. | |
| 9,396,638 B2 | 7/2016 | Wildman et al. | |
| 9,311,807 B2 | 8/2016 | Schultz et al. | |
| 9,406,212 B2 | 8/2016 | De Luca et al. | |
| 9,418,535 B1 | 8/2016 | Felch et al. | |
| 9,418,536 B1 | 8/2016 | Felch et al. | |
| 9,449,219 B2 | 9/2016 | Bilet et al. | |
| 9,477,543 B2 | 10/2016 | Henley et al. | |
| 9,497,832 B2 | 11/2016 | Verberkt et al. | |
| D774,060 S | 12/2016 | Dias et al. | |
| 9,513,364 B2 | 12/2016 | Hall et al. | |
| 9,526,380 B2 | 12/2016 | Hamilton et al. | |
| 9,526,806 B2 | 12/2016 | Park et al. | |
| D776,693 S | 1/2017 | Linares et al. | |
| 9,536,415 B2 | 1/2017 | De Luca et al. | |
| 9,558,648 B2 | 1/2017 | Douglas | |
| 9,591,267 B2 | 3/2017 | Lipton et al. | |

(56) References Cited

U.S. PATENT DOCUMENTS

| | | | |
|---|---|---|---|
| 9,613,518 B2 | 4/2017 | Dunn et al. | |
| 9,618,224 B2 | 4/2017 | Emmons et al. | |
| 9,640,059 B2 | 5/2017 | Hyland | |
| 9,672,360 B2 | 6/2017 | Barkan | |
| 9,710,700 B2 | 7/2017 | Bilet et al. | |
| 9,715,242 B2 | 7/2017 | Pillai et al. | |
| 9,721,452 B2 | 8/2017 | Felch et al. | |
| 9,729,945 B2 | 8/2017 | Schultz et al. | |
| 9,784,464 B2 | 10/2017 | Yamamoto et al. | |
| 9,843,743 B2 | 12/2017 | Lewis et al. | |
| 9,856,634 B2 | 1/2018 | Rodenbeck et al. | |
| 9,872,088 B2 | 1/2018 | Fadell et al. | |
| 9,875,639 B2 | 1/2018 | Bone et al. | |
| 9,911,312 B2 | 3/2018 | Wildman et al. | |
| 9,940,819 B2 | 4/2018 | Ferniany | |
| D818,474 S | 5/2018 | Kato et al. | |
| 9,956,306 B2 | 5/2018 | Brais et al. | |
| 9,986,175 B2 | 5/2018 | Frank et al. | |
| 10,087,608 B2 | 10/2018 | Dobizl et al. | |
| 10,223,894 B2 | 3/2019 | Raichman | |
| 10,228,837 B2 | 3/2019 | Hua et al. | |
| 10,235,865 B2 | 3/2019 | Thyroff | |
| 10,251,610 B2 | 4/2019 | Parthasarathy et al. | |
| 10,303,843 B2 | 5/2019 | Bitran et al. | |
| 10,332,382 B2 | 6/2019 | Thyroff | |
| 10,514,817 B2 | 12/2019 | Hua et al. | |
| 10,565,844 B2 | 2/2020 | Pourmohammad et al. | |
| 10,602,474 B2 | 3/2020 | Goldstein | |
| 10,607,147 B2 | 3/2020 | Raykov et al. | |
| 2002/0111698 A1 | 8/2002 | Graziano et al. | |
| 2002/0130868 A1 | 9/2002 | Smith | |
| 2003/0028269 A1 | 2/2003 | Spriggs et al. | |
| 2003/0030637 A1 | 2/2003 | Grinstein et al. | |
| 2003/0046862 A1 | 3/2003 | Wolf et al. | |
| 2003/0071814 A1 | 4/2003 | Jou et al. | |
| 2003/0078677 A1 | 4/2003 | Hull et al. | |
| 2003/0083957 A1 | 5/2003 | Olefson | |
| 2003/0103075 A1 | 6/2003 | Rosselot | |
| 2003/0171851 A1 | 9/2003 | Brickfield et al. | |
| 2003/0214400 A1 | 11/2003 | Mizutani et al. | |
| 2003/0233432 A1 | 12/2003 | Davis et al. | |
| 2004/0001009 A1 | 1/2004 | Winings et al. | |
| 2004/0064260 A1 | 4/2004 | Padmanabhan et al. | |
| 2004/0143474 A1 | 7/2004 | Haeberle et al. | |
| 2004/0153437 A1 | 8/2004 | Buchan | |
| 2004/0168115 A1 | 8/2004 | Bauernschmidt et al. | |
| 2004/0233192 A1 | 11/2004 | Hopper | |
| 2004/0260411 A1 | 12/2004 | Cannon | |
| 2005/0010460 A1 | 1/2005 | Mizoguchi et al. | |
| 2005/0097162 A1 | 5/2005 | Budike, Jr. | |
| 2005/0119767 A1 | 6/2005 | Kiwimagi et al. | |
| 2005/0143863 A1 | 6/2005 | Ruane et al. | |
| 2005/0267900 A1 | 12/2005 | Ahmed et al. | |
| 2006/0004841 A1 | 1/2006 | Heikkonen et al. | |
| 2006/0009862 A1 | 1/2006 | Imhof et al. | |
| 2006/0017547 A1 | 1/2006 | Buckingham et al. | |
| 2006/0020177 A1 | 1/2006 | Seo et al. | |
| 2006/0025891 A1* | 2/2006 | Budike | H05B 47/19 700/275 |
| 2006/0028471 A1 | 2/2006 | Kincaid et al. | |
| 2006/0029256 A1 | 2/2006 | Miyoshi et al. | |
| 2006/0058900 A1 | 3/2006 | Johanson et al. | |
| 2006/0067545 A1 | 3/2006 | Lewis et al. | |
| 2006/0067546 A1 | 3/2006 | Lewis et al. | |
| 2006/0077255 A1 | 4/2006 | Cheng | |
| 2006/0184326 A1 | 8/2006 | McNally et al. | |
| 2006/0231568 A1 | 10/2006 | Lynn et al. | |
| 2006/0265664 A1 | 11/2006 | Simons et al. | |
| 2006/0279630 A1 | 12/2006 | Aggarwal et al. | |
| 2007/0016955 A1 | 1/2007 | Goldberg et al. | |
| 2007/0055757 A1 | 3/2007 | Mairs et al. | |
| 2007/0055760 A1 | 3/2007 | McCoy et al. | |
| 2007/0061046 A1 | 3/2007 | Mairs et al. | |
| 2007/0067062 A1 | 3/2007 | Mairs et al. | |
| 2007/0088534 A1 | 4/2007 | MacArthur et al. | |
| 2007/0090951 A1 | 4/2007 | Chan et al. | |
| 2007/0091091 A1 | 4/2007 | Gardiner et al. | |
| 2007/0101433 A1 | 5/2007 | Louch et al. | |
| 2007/0114295 A1 | 5/2007 | Jenkins | |
| 2007/0120652 A1 | 5/2007 | Behnke | |
| 2007/0139208 A1 | 6/2007 | Kates | |
| 2007/0216682 A1 | 9/2007 | Navratil et al. | |
| 2007/0219645 A1 | 9/2007 | Thomas et al. | |
| 2007/0239484 A1 | 10/2007 | Arond et al. | |
| 2007/0268122 A1 | 11/2007 | Kow et al. | |
| 2008/0001763 A1 | 1/2008 | Raja et al. | |
| 2008/0027885 A1 | 1/2008 | Van Putten et al. | |
| 2008/0036593 A1 | 2/2008 | Rose-Pehrsson et al. | |
| 2008/0046388 A1 | 2/2008 | Budike, Jr. | |
| 2008/0062167 A1 | 3/2008 | Boggs et al. | |
| 2008/0099045 A1 | 5/2008 | Glenn et al. | |
| 2008/0103798 A1 | 5/2008 | Domenikos et al. | |
| 2008/0120396 A1 | 5/2008 | Jayaram et al. | |
| 2008/0144885 A1 | 6/2008 | Zucherman et al. | |
| 2008/0183424 A1 | 7/2008 | Seem | |
| 2008/0194009 A1 | 8/2008 | Marentis | |
| 2008/0198231 A1 | 8/2008 | Ozdemir et al. | |
| 2008/0209342 A1 | 8/2008 | Taylor et al. | |
| 2008/0222565 A1 | 9/2008 | Taylor et al. | |
| 2008/0224862 A1 | 9/2008 | Cirker | |
| 2008/0242945 A1 | 10/2008 | Gugliotti et al. | |
| 2008/0250800 A1 | 10/2008 | Wetzel | |
| 2008/0279420 A1 | 11/2008 | Masticola et al. | |
| 2008/0280275 A1 | 11/2008 | Collopy | |
| 2008/0303658 A1 | 12/2008 | Melker et al. | |
| 2008/0306985 A1 | 12/2008 | Murray et al. | |
| 2008/0320552 A1 | 12/2008 | Kumar et al. | |
| 2009/0001181 A1 | 1/2009 | Siddaramanna et al. | |
| 2009/0024944 A1 | 1/2009 | Louch et al. | |
| 2009/0065596 A1 | 3/2009 | Seem et al. | |
| 2009/0083120 A1 | 3/2009 | Strichman et al. | |
| 2009/0096791 A1 | 4/2009 | Abshear et al. | |
| 2009/0118845 A1* | 5/2009 | Eldridge | G05B 19/0426 700/86 |
| 2009/0125337 A1 | 5/2009 | Abri | |
| 2009/0125825 A1 | 5/2009 | Rye et al. | |
| 2009/0144023 A1 | 6/2009 | Seem | |
| 2009/0157744 A1 | 6/2009 | McConnell | |
| 2009/0160673 A1 | 6/2009 | Cirker | |
| 2009/0322782 A1 | 12/2009 | Kimchi et al. | |
| 2010/0048167 A1 | 2/2010 | Chow et al. | |
| 2010/0058248 A1 | 3/2010 | Park | |
| 2010/0064001 A1 | 3/2010 | Daily | |
| 2010/0070089 A1 | 3/2010 | Harrod et al. | |
| 2010/0073162 A1 | 3/2010 | Johnson et al. | |
| 2010/0123560 A1 | 5/2010 | Nix et al. | |
| 2010/0134296 A1 | 6/2010 | Hwang | |
| 2010/0156628 A1 | 6/2010 | Ainsbury et al. | |
| 2010/0156630 A1 | 6/2010 | Ainsbury | |
| 2010/0188228 A1 | 7/2010 | Hyland | |
| 2010/0223198 A1 | 9/2010 | Noureldin et al. | |
| 2010/0223593 A1 | 9/2010 | Eldridge et al. | |
| 2010/0249955 A1 | 9/2010 | Sitton | |
| 2010/0286937 A1 | 11/2010 | Hedley et al. | |
| 2010/0318200 A1 | 12/2010 | Foslien et al. | |
| 2010/0324962 A1 | 12/2010 | Nesler et al. | |
| 2011/0010654 A1 | 1/2011 | Raymond et al. | |
| 2011/0057799 A1 | 3/2011 | Taneff | |
| 2011/0077779 A1 | 3/2011 | Fuller et al. | |
| 2011/0083094 A1 | 4/2011 | Laycock et al. | |
| 2011/0087988 A1 | 4/2011 | Ray et al. | |
| 2011/0112854 A1 | 5/2011 | Koch et al. | |
| 2011/0126111 A1 | 5/2011 | Gill et al. | |
| 2011/0154426 A1 | 6/2011 | Doser et al. | |
| 2011/0161124 A1 | 6/2011 | Lappinga et al. | |
| 2011/0169646 A1 | 7/2011 | Raichman | |
| 2011/0184563 A1 | 7/2011 | Foslien et al. | |
| 2011/0202467 A1 | 8/2011 | Hilber et al. | |
| 2011/0273298 A1 | 11/2011 | Snodgrass et al. | |
| 2011/0291841 A1 | 12/2011 | Hollock et al. | |
| 2011/0298301 A1 | 12/2011 | Wong et al. | |
| 2011/0316703 A1 | 12/2011 | Butler et al. | |
| 2011/0320054 A1 | 12/2011 | Brzezowski | |
| 2012/0022700 A1 | 1/2012 | Drees et al. | |

(56) References Cited

U.S. PATENT DOCUMENTS

| | | |
|---|---|---|
| 2012/0039503 A1 | 2/2012 | Chen et al. |
| 2012/0062382 A1 | 3/2012 | Taneff |
| 2012/0075464 A1 | 3/2012 | Derenne et al. |
| 2012/0109988 A1 | 5/2012 | Li et al. |
| 2012/0112883 A1 | 5/2012 | Wallace et al. |
| 2012/0131217 A1 | 5/2012 | Delorme et al. |
| 2012/0158185 A1 | 6/2012 | El-Mankabady et al. |
| 2012/0216243 A1 | 8/2012 | Gill et al. |
| 2012/0224057 A1 | 9/2012 | Gill et al. |
| 2012/0259466 A1 | 10/2012 | Ray et al. |
| 2012/0262472 A1 | 10/2012 | Garr et al. |
| 2012/0272146 A1 | 10/2012 | D'souza et al. |
| 2012/0291068 A1 | 11/2012 | Khushoo et al. |
| 2012/0303652 A1 | 11/2012 | Tseng |
| 2012/0310418 A1 | 12/2012 | Harrod et al. |
| 2013/0055132 A1 | 2/2013 | Foslien |
| 2013/0060794 A1 | 3/2013 | Puttabasappa et al. |
| 2013/0082842 A1 | 4/2013 | Balazs et al. |
| 2013/0086152 A1 | 4/2013 | Hersche et al. |
| 2013/0091631 A1 | 4/2013 | Hayes et al. |
| 2013/0110295 A1 | 5/2013 | Zheng et al. |
| 2013/0169681 A1 | 7/2013 | Rasane et al. |
| 2013/0184880 A1 | 7/2013 | McMahon |
| 2013/0187775 A1 | 7/2013 | Marsden et al. |
| 2013/0204570 A1 | 8/2013 | Mendelson et al. |
| 2013/0229276 A1 | 9/2013 | Hunter |
| 2013/0268293 A1 | 10/2013 | Knudson et al. |
| 2013/0289774 A1 | 10/2013 | Day et al. |
| 2013/0338837 A1 | 12/2013 | Hublou et al. |
| 2014/0032157 A1 | 1/2014 | Khiani |
| 2014/0040998 A1 | 2/2014 | Hsieh |
| 2014/0046490 A1 | 2/2014 | Foslien et al. |
| 2014/0046722 A1 | 2/2014 | Rosenbloom et al. |
| 2014/0058539 A1 | 2/2014 | Park |
| 2014/0167917 A2 | 6/2014 | Wallace et al. |
| 2014/0207291 A1 | 7/2014 | Golden et al. |
| 2014/0292518 A1 | 10/2014 | Wildman et al. |
| 2014/0307076 A1 | 10/2014 | Deutsch |
| 2014/0309757 A1 | 10/2014 | Le Sant et al. |
| 2014/0316582 A1 | 10/2014 | Berg-Sonne et al. |
| 2014/0320289 A1 | 10/2014 | Raichman |
| 2014/0342724 A1 | 11/2014 | Hill et al. |
| 2015/0025329 A1 | 1/2015 | Amarasingham et al. |
| 2015/0032264 A1 | 1/2015 | Emmons et al. |
| 2015/0056909 A1 | 2/2015 | Chien |
| 2015/0070174 A1 | 3/2015 | Douglas |
| 2015/0077258 A1 | 3/2015 | Nelson et al. |
| 2015/0113462 A1 | 4/2015 | Chen et al. |
| 2015/0153918 A1 | 6/2015 | Chen et al. |
| 2015/0161874 A1 | 6/2015 | Thyroff et al. |
| 2015/0167995 A1 | 6/2015 | Fadell et al. |
| 2015/0168949 A1 | 6/2015 | Hua et al. |
| 2015/0194043 A1 | 7/2015 | Dunn et al. |
| 2015/0198707 A1 | 7/2015 | Al-Alusi |
| 2015/0212717 A1 | 7/2015 | Nair et al. |
| 2015/0213222 A1 | 7/2015 | Amarasingham et al. |
| 2015/0213379 A1 | 7/2015 | Nair et al. |
| 2015/0216369 A1 | 8/2015 | Hamilton et al. |
| 2015/0253748 A1 | 9/2015 | Brun et al. |
| 2015/0281287 A1 | 10/2015 | Gill et al. |
| 2015/0346942 A1* | 12/2015 | Oren ................... G06F 8/10 715/769 |
| 2016/0061476 A1 | 3/2016 | Schultz et al. |
| 2016/0061477 A1 | 3/2016 | Schultz et al. |
| 2016/0061794 A1 | 3/2016 | Schultz et al. |
| 2016/0061795 A1 | 3/2016 | Schultz et al. |
| 2016/0063833 A1 | 3/2016 | Schultz et al. |
| 2016/0066067 A1 | 3/2016 | Schultz et al. |
| 2016/0116181 A1 | 4/2016 | Aultman et al. |
| 2016/0139067 A1 | 5/2016 | Grace |
| 2016/0253897 A1 | 9/2016 | Wildman et al. |
| 2016/0255516 A1 | 9/2016 | Hill et al. |
| 2016/0298864 A1 | 10/2016 | Ekolind et al. |
| 2016/0306934 A1 | 10/2016 | Sperry et al. |
| 2016/0314683 A1 | 10/2016 | Felch et al. |
| 2016/0328948 A1 | 11/2016 | Ferniany |
| 2016/0335731 A1 | 11/2016 | Hall |
| 2016/0367925 A1 | 12/2016 | Blackley |
| 2017/0024986 A1 | 1/2017 | Austin |
| 2017/0193792 A1 | 7/2017 | Bermudez Rodriguez et al. |
| 2017/0256155 A1 | 9/2017 | Sengstaken, Jr. |
| 2017/0280949 A1 | 10/2017 | Wildman et al. |
| 2017/0294106 A1 | 10/2017 | Thyroff |
| 2017/0365024 A1 | 12/2017 | Koch et al. |
| 2018/0011455 A1 | 1/2018 | Camarasa et al. |
| 2018/0016773 A1 | 1/2018 | Chandler et al. |
| 2018/0151054 A1 | 5/2018 | Pi |
| 2018/0218591 A1 | 8/2018 | Easter |
| 2018/0259934 A1 | 9/2018 | Piaskowski et al. |
| 2018/0293038 A1 | 10/2018 | Meruva et al. |
| 2018/0301014 A1 | 10/2018 | Worral et al. |
| 2018/0313695 A1 | 11/2018 | Shim et al. |
| 2018/0365957 A1 | 12/2018 | Wright et al. |
| 2019/0051138 A1 | 2/2019 | Easter |
| 2019/0080577 A1* | 3/2019 | Raz ................... G08B 15/00 |
| 2019/0139395 A1 | 5/2019 | Rogachev et al. |
| 2019/0156443 A1 | 5/2019 | Hall |
| 2019/0209719 A1 | 7/2019 | Andersen et al. |
| 2020/0009280 A1 | 1/2020 | Kupa et al. |
| 2020/0074836 A1 | 3/2020 | Kolavennu et al. |
| 2020/0090089 A1 | 3/2020 | Aston et al. |
| 2020/0097875 A1* | 3/2020 | Dhandapani ...... G06Q 10/06313 |
| 2020/0146557 A1 | 5/2020 | Cheung et al. |
| 2020/0200420 A1 | 6/2020 | Nayak et al. |

FOREIGN PATENT DOCUMENTS

| | | |
|---|---|---|
| CN | 103110410 A | 5/2013 |
| CN | 103970977 A | 8/2014 |
| CN | 105116848 A | 12/2015 |
| CN | 108961714 A | 12/2018 |
| CN | 110009245 A | 7/2019 |
| CN | 110084928 A | 8/2019 |
| CN | 110827457 A | 2/2020 |
| EP | 1669912 A1 | 6/2006 |
| EP | 2310981 A1 | 4/2011 |
| JP | 7085166 A | 3/1995 |
| JP | 11024735 A | 1/1999 |
| JP | 11317936 A | 11/1999 |
| JP | 2001356813 A | 12/2001 |
| JP | 2005242531 A | 9/2005 |
| JP | 2005311563 A | 11/2005 |
| KR | 1172747 B1 | 8/2012 |
| KR | 101445367 B1 | 10/2014 |
| KR | 1499081 B1 | 3/2015 |
| WO | 9621264 A3 | 11/1996 |
| WO | 2004029518 A1 | 4/2004 |
| WO | 2005045715 A2 | 5/2005 |
| WO | 2008152433 A1 | 12/2008 |
| WO | 2008157755 A1 | 12/2008 |
| WO | 2009012319 A2 | 1/2009 |
| WO | 2009079648 A1 | 6/2009 |
| WO | 2010106474 A1 | 9/2010 |
| WO | 2011025085 A1 | 3/2011 |
| WO | 2011043732 A1 | 4/2011 |
| WO | 2011057173 A2 | 5/2011 |
| WO | 2011123743 A1 | 10/2011 |
| WO | 2013062725 A1 | 5/2013 |
| WO | 2013178819 A1 | 12/2013 |
| WO | 2014009291 A1 | 1/2014 |
| WO | 2014098861 A1 | 6/2014 |
| WO | 2014135517 A1 | 9/2014 |
| WO | 2016123536 A1 | 8/2016 |
| WO | 2017057274 A1 | 4/2017 |
| WO | 2019046580 A1 | 3/2019 |
| WO | 2020024553 A1 | 2/2020 |

OTHER PUBLICATIONS

"Fuzzy Logic Toolbox 2.1, Design and Stimulate Fuzzy Logic Systems," The MathWorks, 2 pages, May 2004.

"Junk Charts, Recycling Chartjunk as junk art," 3 pages, Oct. 2, 2006.

(56) References Cited

OTHER PUBLICATIONS

"Model Predictive Control Toolbox 2, Develop Internal Model-Based Controllers for Constrained Multivariable Processes," The MathWorks, 4 pages, Mar. 2005.
Honeywell, "Product Guide 2004," XP-002472407,127 pages, 2004.
"Statistics Toolbox, for Use with Matlab," User's Guide Version2, The MathWorks, 408 pages, Jan. 1999.
"Vykon Energy Suite Student Guide," Tridium Inc., 307 pages, Mar. 3, 2006.
"Web Based Energy Information Systems for Energy Management and Demand Response in Commercial Buildings," California Energy Commission, 80 pages, Oct. 2003.
Andover Controls, Network News, vol. 2, No. 2, 8 pages, 1997.
Andover Controls World, 4 pages, Spring 1997.
Bell et al., "Early Event Detection-Results from A Prototype Implementation," AICHE Spring National Meeting, 15 pages, Apr. 2005.
Cadgraphics, "The Cadgraphics User's Guide," 198 pages, 2003.
Carrier Comfort Network CCN Web, "Web Browser User Interface to the Carrier Comfort Network," 2 pages, 2002.
Carrier Comfort Network CCN Web, Overview and Configuration Manual, 134 pages, Apr. 2006.
Carrier Comfort Network CCN Web, Product Data, 2 pages, Apr. 2006.
Carrier, "i-Vu Powerful and Intuitive Front End for Building Control," 2 pages, Aug. 2005.
Carrier, "i-Vu Web-Based Integrated Control System," 3 pages, 2005.
Carrier, Demo Screen Shots, 15 pages, prior to Aug. 27, 2007.
Carrier, i-Vu CCN 4.0, Owner's Guide, 20 pages, Jul. 2007.
Carrier, i-Vu CCN, 7 pages, 2007.
Chan, "Rank Revealing QR Factorizations," Linear Algebra and It's Applications, vol. 88-89, p. 67-82, Apr. 1987.
Circon, "i-Browse Web-Based Monitoring and Control for Facility Management," 2 pages, prior to Aug. 27, 2007.
Australian Application 2009904740, Published copy, 28 pages, Application Filed on Sep. 29, 2009.
Echelon, "Energy Control Solutions with the i.Lon SmartServer," 4 pages, 2007.
Echelon, "i.Lon 100e3 Internet Server Models 72101R-300, 72101R-308, 72102R-300, 72103-R300 . . . " 5 pages, copyright 2002-2007.
Echelon, "i.Lon 100e3 Internet Server New Features," 15 pages, Sep. 2006.
Echelon, "i.Lon SmartServer," 5 pages, 2007.
Honeywell News Release, "Honeywell's New Sysnet Facilities Integration System for Boiler Plant and Combustion Safety Processes," 4 pages, Dec. 15, 1995.
Honeywell, "Excel Building Supervisor-Integrated R7044 and FS90 Ver. 2.0," Operator Manual, 70 pages, Apr. 1995.
Honeywell Home and Building Control Bulletin, "Introduction of the S7350A Honeywell WebPAD Information Appliance," 2 pages, Aug. 29, 2000; Picture of WebPad Device with touch screen, 1 Page; and screen shots of WebPad Device, 4 pages.
Honeywell, Excel 15B W7760B Building Manager Release 2.02.00, Installation Instructions, 28 pages, Dec. 2004.
Honeywell, The RapidZone Solution, Excel 5000 Open System, Application Guide, 52 pages, Jan. 2004.
"Remote Building Monitoring and Operations Home Page," 5 pages, prior to Aug. 27, 2007.
"Carrier: i-Vu CCN," 1 page, printed Mar. 11, 2008.
Carrier: 33CSCCNWEB-01 CCN Web Internet Connection to the Carrier Comfort Network, 1 page, printed Mar. 11, 2008.
"Products," 5 pages, printed Jul. 3, 2007. http://www.docs.hvacpartners.com/idc/groups/public/documents/techlit/gs-controls-ivuccn.rtf.
Lightstat Incorporated, "Internet Programmable Communicating Thermostats," 1 page, printed Mar. 13, 2007. http://www.lightstat.com/products/istat asp.
Sharp, "Actius RD3D Desktop Replacement Notebook with Industry-Breakthrough 3D Screen," 1 page, printed Jun. 16, 2005. http://www.sharpsystems.com/products/pc_notebooks/actius/rd/3d/.
"Lights On A Wireless Lighting Control System," 11 pages, printed Mar. 22, 2007 http://www2.sims.berkeley.edu/courses/is213/s06/projects/lightson;final.html.
I.Lon 100e3 Internet Server, 1 page, prior to Aug. 27, 2007.
I.Lon, SmartServer, 2 pages, prior to Aug. 27, 2007.
I-stat, Demo Screen Shots, 9 pages, printed Mar. 13, 2007.
I-stat, The Internet Programmable Thermostat, 2 pages, prior to Aug. 27, 2007.
Ball, "Green Goal of 'Carbon Neutrality' Hits Limit," TheWall Street Journal, 7 pages, Dec. 30, 2008.
Network Integration Engine (NIE), Johnson Controls, 3 pages, Nov. 9, 2007.
Network Integration Engine (NIE), Product Bulletin, Johnson Controls, pp. 1-11, Jan. 30, 2008.
Kourti, "Process Analysis and Abnormal Situation Detection: From Theory to Practice," IEEE Control Systems Magazine, p. 10-25, Oct. 2002.
Mathew, "Action-Oriented Benchmarking, Using CEUS Date to Identify and Prioritize Efficiency Opportunities in California Commercial Buildings," 26 pages, Jun. 2007.
Morrison et al., "The Early Event Detection Toolkit," Honeywell Process Solutions, 14 pages, Jan. 2006.
Narang, "WEBARC: Control and Monitoring of Building Systems Over the Web," 53 pages, May 1999.
Olken et al., "Object Lessons Learned from a Distributed System for Remote Building Monitoring and Operation," ACM SIGPLAN Notices, vol. 33, No. 10, pp. 284-295, Oct. 1998.
Proliphix, Inc., "Proliphix IP Devices: HTTP API," 28 pages, Jan. 23, 2006.
Proliphix, Inc., "Remote Management User Guide," 12 pages, prior to Aug. 27, 2007.
Rogan et al., "Smart and Final Food Stores: A Case Study in Web Based Energy Information and Collection," Web Based Energy Information and Control Systems: Case Studies and Application, Chapter 6, p. 59-64, 2005.
Sharp, "Actius AL3DU 3D LC Display High Performance 3D Visualization," 2 pages, prior to Mar. 17, 2006.
So et al., "Building Automation on the Information Superhighway," ASHRAE Transactions, vol. 104, Part 2, pp. 176-191, 1998.
So et al., "Building Automation Systems on the Internet," Facilities vol. 15, No. 5/6, pp. 125-133, May/Jun. 1997.
Talon, "Raptor Controller," 6 pages, Oct. 2003.
Talon, "Workstation Software," 4 pages, Nov. 2002.
Trane, "System Programming, Tracer Summit Version 14, BMTW-SVP01D-EN," 623 pages, 2002.
Lucid Design Group, Inc., "Building Dashboard," 2 pages, Printed May 30, 2013.
"America's Largest Managed Security Services Provider Launches Comprehensive, Integrated Covid-19 Safety Program for Office Buildings and Suites," KastleSafeSpaces, 5 pages, May 11, 2020.
"Biometric Door Reader With Body Temperature Detection," Kintronics, 9 pages, accessed May 21, 2020.
"Body Surface Temperature Screening with Alarm Function TVS-200IS/TVS-500IS," Nippon Avionics Co., 3 pages, accessed May 21, 2020.
"BriefCam announces video analytics innovation for contact tracing, physical distancing, occupancy management and face mask detection," BriefCam LTD, 11 pages, Jun. 5, 2020.
"Thermal Imaging SmartPhone Can Be used For Temperature Screening of People," CAT, 3 pages, accessed Jul. 13, 2020.
"Contact Tracing Now Available on Identiv's Hirsch Velocity Access Control Platform," IDENTIV, 5 pages, May 21, 2020.
Silva et al., "Cough localization for the detection of respiratory diseases in pig houses," ScienceDirect, 7 pages, May 28, 2008.
Oey et al., "Evaluation of Isolation Compliance Using Real Time Video In Critical Care," North Shore University Hospital, 1 page, Oct. 9, 2015.
"Facial Attendace System With Temperature Screening Now In India," IANS, 5 pages, Mar. 19, 2020.
"Plan to Re-Open," EHIGH, 16 pages, accessed Jun. 13, 2020.
"How Smarter AI-Powered Cameras Can Mitigate the Spread of Wuhan Novel," AnyConnect, 22 pages, 2020.

(56) References Cited

OTHER PUBLICATIONS

"How to fight COVID-19 with machine learning," DataRevenue, 20 pages, accessed May 25, 2020.
Honeywell, "INNCONTROL 5," 2 pages, Aug. 8, 2018.
"IP Door Access Control," Kintronics, 21 pages, 2014.
"Kogniz AI Health Response Platform," Kogniz, 9 pages, accessed May 21, 2020.
"Machine Learning Could Check If You're Social Distancing Properly at Work," MIT Technology Review, 7 pages, Apr. 17, 2020.
Punn et al., "Monitoring COVID-19 social distancing with person detection and tracking via fine-tuned YOLO v3 and Deepsort techniques," 10 pages, May 6, 2020.
Burt, "NEC launches dual face biometric and fever detection system for access control," Biometric Update, 4 pages, May 8, 2020.
"Remote temperature monitoring," AXIS Communication, 10 pages, 2014.
"FebriEye-AI Based Thermal Temperature Screening System," vehant, 1 page, 2020.
"See The Worid In A New Way Hikvision Thermal Cameras," Hikvision, 12 pages. 2017.
Allain, "Trying out the iPhone Infrared Camera: The FLIR One," Wired, 15 pages, 2014.
Dasgupta, "Your voice may be able to tell you if you have Covid," Hindustan Times, 4 pages, Apr. 16, 2020.
Ganguty, "Gurugram-based startup Staqu has modified AI-powered JARVIS to battle coronavirus," Yourstory, 7 pages, Mar. 31, 2020.
Trane, "Creating Input/Output Objects," 196 pages, retrieved Jul. 10, 2020.
Trane, "Using the Graphing Control Editor," 181 pages, retrieved Jul. 10, 2020.
Genetec, Feature note, "Dashboards, A comprehensive view of your security and operations", pp. 2, 2019 Genetec Inc.
Bocicor et al. "Wireless Sensor Network based System for the Prevention of Hospital Acquired Infections", arxiv.org, Cornell University Ithaca, NY 14853, May 2, 2017, XP080947042, (Abstract).
Shhedi et al., "Traditional and ICT Solutions for Preventing the Hospital Acquired Infection", 2015 20th International Conference on Control Systems and Computer Science, IEEE, May 27, 2015, pp. 867-873, XP033188038.
Extended European Search Report, EP application No. 20151295.1, pp. 13, dated May 26, 2020.
U.S. Appl. No. 14/109,496, filed Dec. 17, 2013.
"What is the GE Nucleus Home Manager? How can a Home Manager Help with Energy Conservation?" GE Nucleus, 2 pages, printed Jan. 15, 2013. www.geappliances.com/home-energy-manager/about-energy-monitors.htm.
"Lucid Design Group—Building Dashboard Network—Apps," 7 pages, Jan. 15, 2013. vww.luciddesigngroup.eom/network/apps.php#homepage.
Preuveneers et al., "Intelligent Widgets for Intuitive Interaction and Coordination in Smart Home Environments," IEEE Eighth International Conference on Intelligent Environments, pp. 157-164, 2012.
Wu et al., "A Web 2.0 Based Scientific Application Framework," 7 pages, prior to Jul. 24, 2014.
"The Home Dashboard," CRBM info@hand website, 46 pages, prior to Apr. 25, 2013.
"Free Facilities Dashboards," eSight Energy Website, 2 pages, prior to Apr. 25, 2013.
Alerton Building Controls, Gallery Prints, 7 pages, Dec. 19, 2013.
Carter, "Industrial Energy Management Dashboards Require a Toolkit," Cross Automation, 11 pages, Nov. 4, 2013.
U.S. Appl. No. 14/169,071, filed Jan. 30, 2014.
U.S. Appl. No. 14/169,083, filed Jan. 30, 2014.
U.S. Appl. No. 14/461,188, filed Aug. 15, 2014.
U.S. Appl. No. 14/482,607, filed Sep. 10, 2014.
e-homecontrols.com, "e-Home Controls Website," link to actual website no longer works, 1 page, prior to Dec. 19, 2013.
"C&C (/)—Omniboard," 5 pages, Dec. 19, 2013. http://www.ccbac.com.
"DomController Home Automation Software—Control Anything from Anywhere," 11 pages, printed Jan. 6, 2015. http://www.domcontrollercom/en/.
"Novar OPUS BAS," 1 page, prior to Feb. 13, 2013. http://www.novar.com/ems-bas/opus-building-automation-system.
"A3D Interactive Environment for Automated Building Control," Master's Dissertation, Instituto Superior Tecnico, 120 pages, Nov. 2012.
Panduit Corp., "Enable a Building Automation with Panduit Enterprise Solutions," 4 pages, Nov. 2012.
Honeywell, "WEBs-AX Web-Enabled Building Solutions," sales brochure, Honeywell International Inc., Mar. 2009.
Honeywell, "Attune Advisory Services," press release, Honeywell International Inc., Mar. 20, 2012.
EnteliWEB Overview, web pages retrieved on May 9, 2013 from http://deltacontrols.com/products/facilities-management/supervisory-software et seq. by the Internet Archive at web.archive.org.
"BACnet Protocol Implementation Conformance Statement" for enteliWEB, Delta Controls, Jul. 17, 2013.
Castle, "7 Software Platforms that Make Building Energy Management Easy," http://greentechadvocates.com/2012/11/28/7-software-platforms-that-make-building-energy-managment-easy/, Nov. 28, 2012.
EnteliWEB "Software: Enterprise Energy Management", catalog sheet, Delta Controls, 2012.
EnteliWEB "Software: Enterprise Energy Management", catalog sheet, Delta Controls., 2010.
"Intelligent Building Management Systems in Miami," Advanced Control Corp., Mar. 7, 2013.
"The Ohio State University," BACnet International Journal, vol. 5, p. 4, Jan. 2013.
Bobker et al., "Operational Effectiveness in Use of BAS," Proceedings of the 13th International Conference for Enhanced Building Operations, Oct. 8, 2013.
Castelo, "A 3D Interactive Environment for Automated Building Control," Elsevier, Nov. 8, 2012.
"Creston Special Report: How Intelligent building management solutions are reducing operational costs," Creston, 2012.
"Building Automation Software Solutions," Iconics, 2013.
Lacey, "The Top 10 Software Vendors Connecting Smart Buildings to the Smart Grid," http://www.greentechmedia.com/articles/read/the-top-10-companies-in-enterprise-smart-grid, Jul. 18, 2013.
"NiagraAX Product Model Overview," Tridium, Inc., 2005.
"An Overview of NiagraAX: A comprehensive software platform designed to create smart device applications," Tridium, Inc., 2005.
"Phoenix Controls Portal," Phoenix Controls, Inc., 2013.
Quirk, "A Brief History of BIM," Arch Daily, Dec. 7, 2012.
Samad et al., "Leveraging the Web: A Universal Framework for Building Automation," Proceedings of the 2007 American Control Conference, Jul. 11, 2007.
Sinha et al., "9 Key attributes of energy dashboards and analytics tools," Aug. 28, 2013, https://www.greenbiz.com/blog/2013/08/28/9-key-attributes-energy-dashboards-and=analytics-tools.
Sinopoli, "Dashboards For Buildings," http://www/automatedbuildings.com/news/dec10/articles/sinopoli/101119034404sinopoli.html, Dec. 2010.
Sinopoli, "Modeling Building Automation and Control Systems," http://www.automatedbuildings.com/news/jun13/articles/sinopoli/130521122303sinopoli.html, Jun. 2013.
Zito, "What is Tridium Part 1," http://blog.buildingautomationmonthly.com/what-is-tridium/, May 12, 2013.
Zito, "What is Tridium Part 2," http://blog.buildingautomationmonthly.com/tridium-part-2/, Sep. 10, 2013.
International Search Report and Written Opinion dated Jul. 17, 2018 for International PCT Application No. PCT/US2018/025189 (12 pages).
"Data analytics and smart buildings increase comfort and energy efficiency", https://www.microsoft.com/itshowcase/Article/Content/845/Data-analytics-and-smart-buildings-increase-comfort-and-energy-efficiency, Dec. 19, 2016, 8 pages.
Donnelly, "Building Energy Management: Using Data as a Tool", http://www.buildingefficiencyinitiative.org/sites/default/files/legacy/InstituteBE/media/Library/Resources/Existing-Building-Retrofits/Using-Building-Data-as-a-Tool.pdf, Oct. 2012, 9 pages.

(56) References Cited

OTHER PUBLICATIONS

"ASHRAE Dashboard Research Project," 29 pages, Aug. 28, 2008.
Extended European Search Report, European Patent Office, EP Application No. 22155371.2, dated Jul. 13, 2022 (9 pgs).

* cited by examiner

Parent Hierarchal Level Object —— 32
Child Hierarchal Level Object —— 34
    Asset —— 34a
    Asset —— 34b
Child Hierarchal Level Object —— 36
    Asset —— 36a
    Asset —— 36b
    Grandchild Hierarchal Level Object —— 38
        Asset —— 38a
        Asset —— 38b
    Grandchild Hierarchal Level Object —— 40
        Asset —— 40a
        Asset —— 40b

FIG. 3

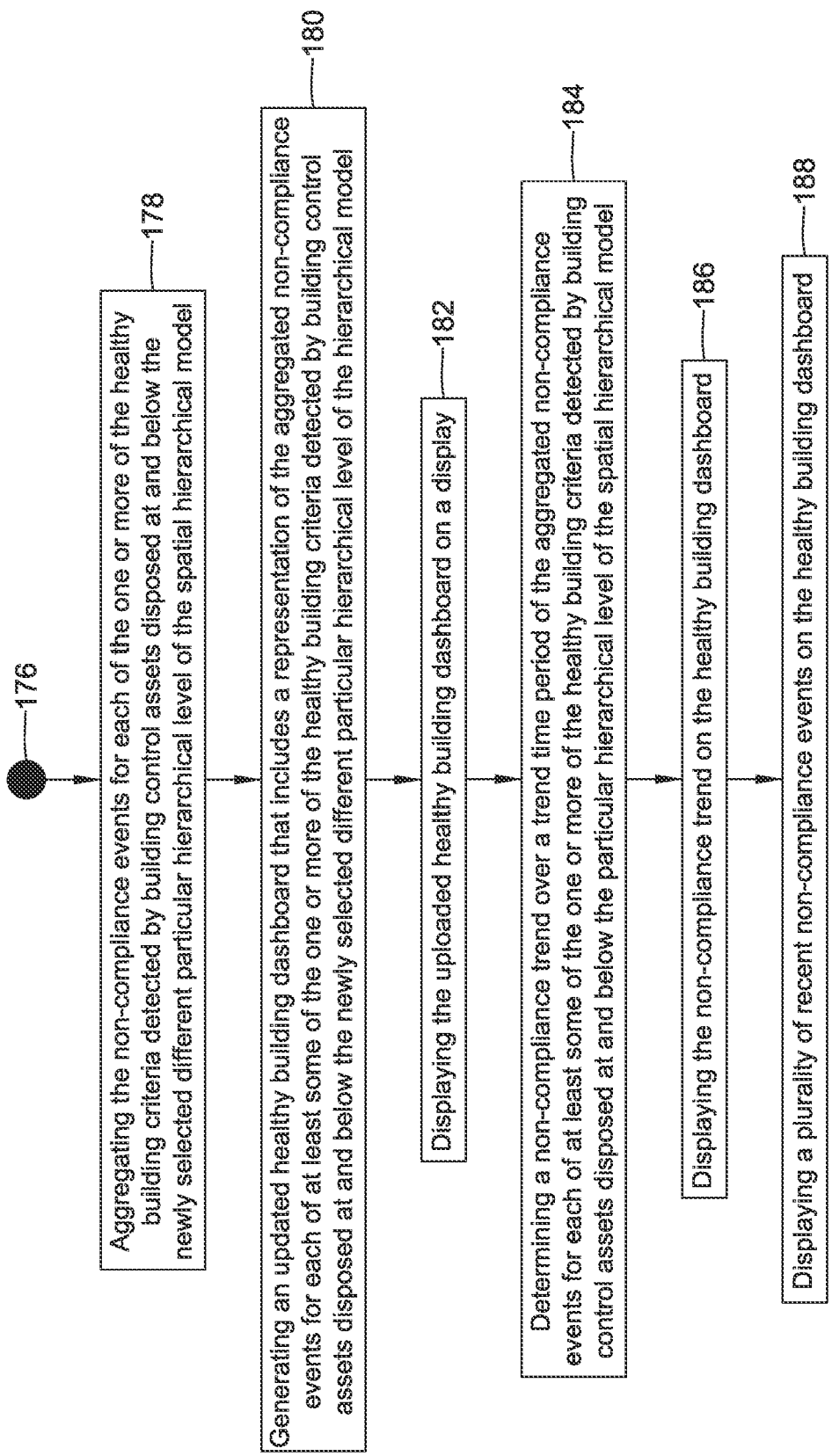

Hierarchy Builder

Add, Update or Remove data for your Hierarchy Structure — 420

| | Type | Name | Parent | Device Type | Device Type | Tag1 |
|---|---|---|---|---|---|---|
| 434 | Folder | Oracle | Oracle | | | |
| 436 | Folder | Ground Floor | Ground Floor | | | |
| 438 | Folder | Reception | Reception | | | |
| 440 | Device | Entrance Camera 1 | Reception | Camera | 10.1.1.182 | |
| | Folder | Server Room | Ground Floor | | | |
| | Device | Controller1 | Ground Floor | Controller | 10.1.1.183 | |
| | Device | Camera1 | Server Room | Camera | 10.1.1.184 | |
| 442 | Folder | Office Supplies | Ground Floor | | | |
| | Device | Camera2 | Office Supplies | Camera | 10.1.1.185 | |
| 444 | Folder | Healthcare | Ground Floor | | | |
| | Device | Reader1 | Healthcare | Card Reader | 10.1.1.186 | |
| | Device | Camera3 | Healthcare | Camera | 10.1.1.187 | |
| 446 | Folder | Elevator Area | Ground Floor | | | |
| 450 | Device | Camera4 | Elevator Area | Camera | 10.1.1.188 | Elevator |
| 448 | Folder | First Floor | Oracle | | | |

FIG. 22

| | A | | B | | C | | D |
|---|---|---|---|---|---|---|---|
| | Space ID | v | Space Name | v | Space Type | v | Address |
| 1 | | | \US East | | Region | | |
| 2 | | | \Atlanta | | Site | | |
| 3 | | | \\Honeywell Midtown | | Building | | |
| 4 | | | \\New Jersey | | Site | | |
| 5 | | | \\Honeywell NJ Office | | Building | | |
| 6 | | | \US West | | Region | | |
| 7 | | | \San Francisco | | Site | | |
| 8 | | | \\Honeywell SFO Office | | Building | | |
| 9 | | | \\San Diego | | Site | | |

FIG. 23

HIERARCHY MODEL BUILDER FOR BUILDING A HIERARCHICAL MODEL OF CONTROL ASSETS

TECHNICAL FIELD

The present disclosure relates generally to spatial modeling of control assets. More particularly, the present disclosure relates to flexible spatial modeling of control assets that can be deployed for a variety of different verticals.

BACKGROUND

Control systems can include a large number of control assets that are divided between parts of a building or other facility, between different buildings or facilities within a region, and/or between different geographic regions in which a particular enterprise has ongoing operations. Examples of verticals include buildings and building control systems, various industrial and manufacturing processes, large facilities such as airports and casinos, data centers and others. It will be appreciated that the control assets and how they are arranged can vary considerably based upon the vertical in which the control assets are deployed and the particular needs of the end user. What would be desirable are methods and systems for organizing large number of assets in a hierarchical model.

SUMMARY

The present disclosure relates to spatial modeling of control assets. In one example, a method provides for building a spatial hierarchical model of a plurality of building control assets that is configured to provide spatial context of the plurality of building control assets to an operator when the operator is monitoring and/or controlling the plurality of building control assets. The illustrative method includes accepting user input via one or more screens to add and name each of one or more first level spaces at a first level of the spatial hierarchical model and accepting user input via one or more screens to select a selected one of the first level spaces of the spatial hierarchical model and add and name each of one or more child level spaces that are spatially part of the selected first level space at a second level of the spatial hierarchical model. A graphical representation of one or more of the first level spaces and one or more corresponding child level spaces is displayed along with a listing of at least some of the plurality of building control assets. User input is accepted to assign selected building control assets from the listing of at least some of the plurality of building control assets to a selected child level space.

In another example, a method includes displaying one or more screens that enable a user to create one or more geographic region-level folders of a hierarchical folder structure. One or more screens are displayed that enable a user to create one or more location-specific folders within one or more of the geographic region-level folders of the hierarchical folder structure. One or more screens are displayed that enable a user to dispose one or more assets within one or more folders of the hierarchical folder structure. The hierarchical folder structure is analyzed to determine relationships between the one or more geographic region-level folders, the one or more location-specific folders and the one or more assets in order to assign a unique identifier to each folder and to each asset in the hierarchical folder structure. One or more screens are displayed that display the hierarchical folder structure.

In another example, a system monitors and/or controls a plurality of building control assets. The system includes an input/output that is operatively coupled to the plurality of assets, a display and one or more processors that are operatively coupled to the input/output and the display. The one or more processors are configured to display one or more screens on the display that allow a user to add and name each of one or more first level spaces at a first level of a spatial hierarchical model and to display one or more screens on the display that allow the user to select a selected one of the first level spaces of the spatial hierarchical model and add and name each of one or more child level spaces that are spatially part of the selected first level space at a second level of the spatial hierarchical model. The one or more processors are configured to display a graphical representation of one or more of the first level spaces and one or more corresponding child level spaces and to display a listing of at least some of the plurality of building control assets operatively coupled to the input/output. The one or more processors are configured to accept user input to assign selected building control assets from the listing of at least some of the plurality of building control assets to a selected child level space and to accept user input to monitor and/or control at least some of the plurality of building control assets using the spatial hierarchical model.

The preceding summary is provided to facilitate an understanding of some of the innovative features unique to the present disclosure and is not intended to be a full description. A full appreciation of the disclosure can be gained by taking the entire specification, claims, figures, and abstract as a whole.

BRIEF DESCRIPTION OF THE FIGURES

The disclosure may be more completely understood in consideration of the following description of various examples in connection with the accompanying drawings, in which:

FIG. 3 is a schematic diagram of an illustrative spatial hierarchical model;

FIGS. 9A and 9B are flow diagrams that together show an illustrative method.

FIG. 22 is a screen shot showing the spatial hierarchy model created in FIGS. 13 through 18 displayed in a tabular format;

FIG. 23 is a screen shot showing an alternate way of forming a spatial hierarchy model;

Figure 1:
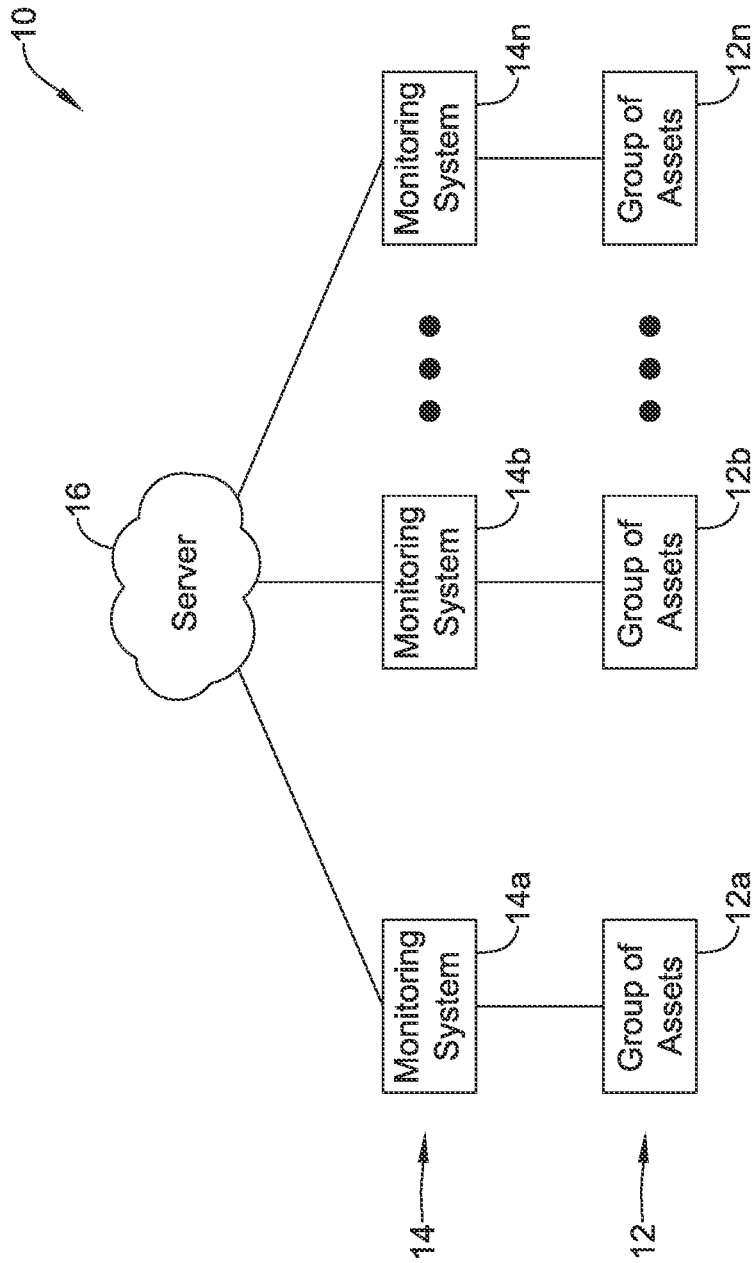
FIG. 1 is a schematic block diagram of an illustrative system for organizing and monitoring a variety of control assets.

While the disclosure is amenable to various modifications and alternative forms, specifics thereof have been shown by way of example in the drawings and will be described in detail. It should be understood, however, that the intention is not to limit the disclosure to the particular examples described. On the contrary, the intention is to cover all modifications, equivalents, and alternatives falling within the spirit and scope of the disclosure.

DESCRIPTION

The following description should be read with reference to the drawings, in which like elements in different drawings are numbered in like fashion. The drawings, which are not necessarily to scale, depict examples that are not intended to limit the scope of the disclosure. Although examples are illustrated for the various elements, those skilled in the art will recognize that many of the examples provided have suitable alternatives that may be utilized.

All numbers are herein assumed to be modified by the term "about", unless the content clearly dictates otherwise. The recitation of numerical ranges by endpoints includes all numbers subsumed within that range (e.g., 1 to 5 includes 1, 1.5, 2, 2.75, 3, 3.80, 4, and 5).

As used in this specification and the appended claims, the singular forms "a", "an", and "the" include the plural referents unless the content clearly dictates otherwise. As used in this specification and the appended claims, the term "or" is generally employed in its sense including "and/or" unless the content clearly dictates otherwise.

It is noted that references in the specification to "an embodiment", "some embodiments", "other embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is contemplated that the feature, structure, or characteristic may be applied to other embodiments whether or not explicitly described unless clearly stated to the contrary.

FIG. 1 is a schematic block diagram of an illustrative system 10 for organizing and monitoring a variety of control assets. The illustrative system 10 includes a number of groups of assets 12, individually labeled as 12a, 12b and through 12n. A particular group of assets 12 may, for example, include at least some of the assets within a building or a portion of a building such as a wing of a building, or perhaps a particular floor of the building. A particular group of assets 12 may include at least some of the assets within two or more buildings that are grouped within a geographical region. A particular group of assets 12 may include at least some of the assets that are grouped within two or more different geographic regions within an enterprise such as a business. The assets may be grouped differently than shown. These are just examples.

The system 10 may include any number of groups of assets 12. Each group of assets 12 may include any of a variety of different assets. Examples of assets include but are not limited to devices such as cameras and access control devices, door alarms, window alarms and the like. Assets may include a variety of different types of sensors, such as but not limited to temperature sensors, humidity sensors, occupancy sensors, lighting sensors and the like. In some cases, the assets included within each of the groups of assets 12 may include Heating, Ventilating and Air Conditioning (HVAC) system components such as heating sources and cooling sources. In some cases, at least some of the assets within one or more of the groups of assets 12 may include environmental sensors such as but not limited to air temperature (both indoor and outdoor), air humidity (both indoor and outdoor), CO (carbon monoxide) sensors, $CO_2$ (carbon dioxide) sensors, $NO_x$ (nitric acid) sensors, TVOC (total volatile organic compounds) sensors and the like. In some cases, the assets included within each of the groups of assets 12 may include industrial and/or manufacturing process control assets. These are just examples.

The illustrative system 10 may include a number of monitoring systems 14, individually labeled as 14a, 14b and through 14n. In some cases, a particular monitoring system 14 may be operably coupled with at least some of the assets within a particular group of assets 12, and may receive operational and/or other information from at least some of the assets within the particular group of assets 12. A particular monitoring system 14 may provide operational instructions to at least some of the assets within the particular group of assets 12. While FIG. 1 shows one monitoring system 14 coupled to one group of assets 12, it will be appreciated that this is merely illustrative. In some cases, one monitoring system 14 may be operationally coupled with two or more different groups of assets 12. One group of assets 12 may, for example, be operationally coupled with two or more different monitoring systems 14.

The monitoring systems 14 are shown as being operationally coupled with a cloud-based server 16. The cloud-based server 16 may represent one or more distinct computing sources such as one or more servers. In some cases, each of the monitoring systems 14 may receive operational instructions from the cloud-based server 16, and the monitoring systems 14 may pass those operational instructions or translations thereof down to the appropriate assets within the groups of assets 12. The monitoring systems 14 may pass operational data from assets within the groups of assets 12 up to the cloud-based server 16. While each of the monitoring systems 14 are shown as being distinct from both the cloud-based server 16 and their corresponding group of assets 12, it is contemplated that at least some of the functions of at least some of the monitoring systems 14 may be manifested within the cloud-based server 16. In some cases, at least some of the functions of at least some of the monitoring systems 14 may be manifested within one or more of the assets within the groups of assets 12. In some cases, the monitoring systems 14 may be implemented at least in part by an edge controller, such as an edge gateway or the like.

The cloud-based server 16 may be configured to monitor performance of the assets within the groups of assets 12. This may include any of a variety of different Industrial Internet of Things (IIOT) systems. This can include monitoring performance of security-related assets, including detecting alarms. Some alarms may be legitimate, while others may be false alarms that can be canceled once investigated. Alternatively, or in addition, this can include monitoring performance of HVAC, lighting, fire suppression, and/or industrial and/or manufacturing control systems. In some cases, the cloud-based server 16 may be configured to monitor or track various healthy building-related criterial that can be used to ascertain how well a facility or a portion of a facility, facilities within a geographic region and/or facilities within each of a number of geographic regions under the umbrella of a company are performing with respect to meeting healthy building guidelines.

In some cases, the cloud-based server 16 may be configured to organize the assets within the groups of assets 12 into a spatial hierarchical model that provides spatial context to the assets. This spatial hierarchical model can be helpful in being able to monitor and track assets at various hierarchical levels in the spatial hierarchical model, as will be discussed further herein.

Figure 2:
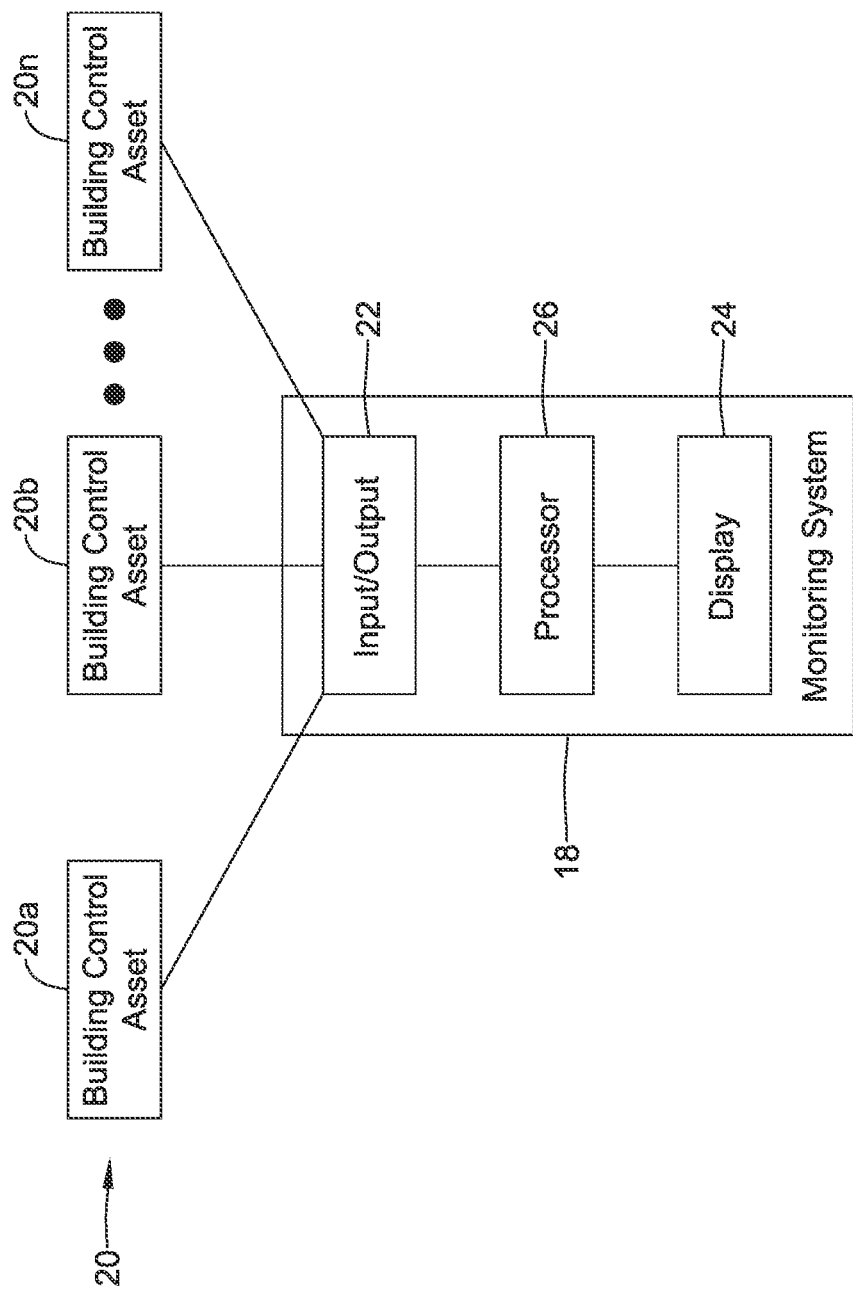
FIG. 2 is a schematic block diagram of an illustrative monitoring system.

FIG. 2 is a schematic block diagram of an illustrative monitoring system 18. The monitoring system 18 may be considered as being an example of the monitoring systems 14. The monitoring system 18 is configured to monitor and/or control a plurality of building control assets 20, individually labeled as 20*a*, 20*b* and through 20*n*. The building control assets 20 may be considered as being examples of the assets within the groups of assets 12. The monitoring system 18 may include an input/output 22 that is operably coupled to the plurality of building control assets 20. The input/output 22 may include one or more ports that are configured to send instructions and other data to each of the plurality of building control assets 20 and/or to receive information from each of the plurality of building control assets 20. In the example shown, the monitoring system 18 includes a display 24 and a processor 26 that is operatively coupled to the input/output 22 and to the display 24. While one processor 26 is shown, it will be appreciated that the processor 26 may represent two or more distinct processors within the monitoring system 18.

The processor 26 is configured to display one or more screens on the display 24 that allow a user to add and name each of one or more first level spaces at a first level of a spatial hierarchical model. The processor 26 is configured to display one or more screens on the display 24 that allow the user to select a selected one of the first level spaces of the spatial hierarchical model and add and name each of one or more child level spaces that are spatially part of the selected first level space at a second level of the spatial hierarchical model. The processor 26 is configured to display a graphical representation of one or more of the first level spaces and one or more corresponding child level spaces as well as to display a listing of at least some of the plurality of building control assets operatively coupled to the input/output. The processor 26 may be configured to accept user input to assign selected building control assets 20 from the listing of at least some of the plurality of building control assets 20 to a selected child level space and to accept user input to monitor and/or control at least some of the plurality of building control assets 20 using the spatial hierarchical model. In some cases, accepting user input to assign selected building control assets 20 from the listing of at least some of the plurality of building control assets 20 to the selected child level space comprises dragging and dropping selected building control assets from the listing of at least some of the plurality of building control assets 20 to the selected child level space. An particular example of such a system is shown and described with respect to FIGS. 13-19.

Reference has been made to hierarchical levels within a spatial hierarchical model. FIG. 3 is a schematic illustration of an illustrative spatial hierarchical model 30. It will be appreciated that the illustrative spatial hierarchical model 30 is highly schematic, as an actual spatial hierarchical model, even for a portion of a building, would likely include additional hierarchical levels relative to what is shown here, and at least some of the hierarchical levels may include a substantially greater number of assets located within those hierarchical levels. As illustrated, the spatial hierarchical model 30 may include a parent hierarchical level object 32. There may be additional higher level hierarchical level objects (not illustrated) above the parent hierarchical level object 32, if desired. Under the parent hierarchical level object 32, as indicated by relative indentation, are two child hierarchical level objects 34 and 36. In this example, the parent hierarchical level object 32 may refer to a campus of a company, and the two child hierarchical level objects 34 and 36 may each refer to specific building within that campus. In another example, the parent hierarchical level object 32 may refer to a company having operations within two geographic regions (east and west), and each of the child hierarchical level objects 34 and 36 refer to one of those two geographic regions within the company represented by the parent hierarchical level object 32. These are just examples.

The spatial hierarchical model 30, as shown, also includes grandchild hierarchical level objects 38 and 40. The grandchild hierarchical level object 38 and the grandchild hierarchical level object 40 are both at the same organizational level, and are both children of child hierarchical level object 36. In the previous example, if the child hierarchical level object 36 represents a geographic region, the grandchild hierarchical level object 38 and 40 may each represent particular buildings within the geographic region represented by the child hierarchical level object 36. Continuing with this example, it is contemplated that the spatial hierarchical model 30 may include a number of great grandchild hierarchical level objects below, for example, the grandchild hierarchical level object 38 that each represent a particular zone or space within the particular building represented by the grandchild hierarchical level object 38. This is just an example. It is contemplated that the spatial hierarchical model 30 may have any suitable number of hierarchical levels, depending on the application.

A number of assets have been placed within the spatial hierarchical model 30. In particular, an asset 34*a* and an asset 34*b* have been placed within the child hierarchical level object 34. Similarly, an asset 36*a* and an asset 36*b* have been placed within the child hierarchical level object 36. An asset 38*a* and an asset 38*b* have been placed within the grandchild hierarchical level object 38. An asset 40*a* and an asset 40*b* have been placed within the grandchild hierarchical level object 40. While only two assets are shown in each hierarchical level, it will be appreciated that each hierarchical level object 32, 34, 36, 38, 40 may include any number of assets, and depending on what a particular hierarchical level object 32, 34, 36, 38, 40 represents, may include a substantially greater number of assets.

An asset may be considered as belong to a hierarchical level object that it is assigned to, as well as to higher level hierarchical level objects (e.g. parent and grandparent hierarchical level object). For example, the asset 38*a* may be considered as belonging to the grandchild hierarchical level object 38, and also the child hierarchical level object 36 and the parent hierarchical level object 32. It will be appreciated that within the context of monitoring healthy building performance across any of a number of buildings, other facilities, geographic regions and even companies, the spatial hierarchical model 30 facilitates being able to compile and track aggregated data while also permitting easily drilling down to a lower hierarchical level objects in the model, and the particular assets at (and below) that lower hierarchical level objects in order to better ascertain performance with respect to healthy building guidelines.

Figure 4:
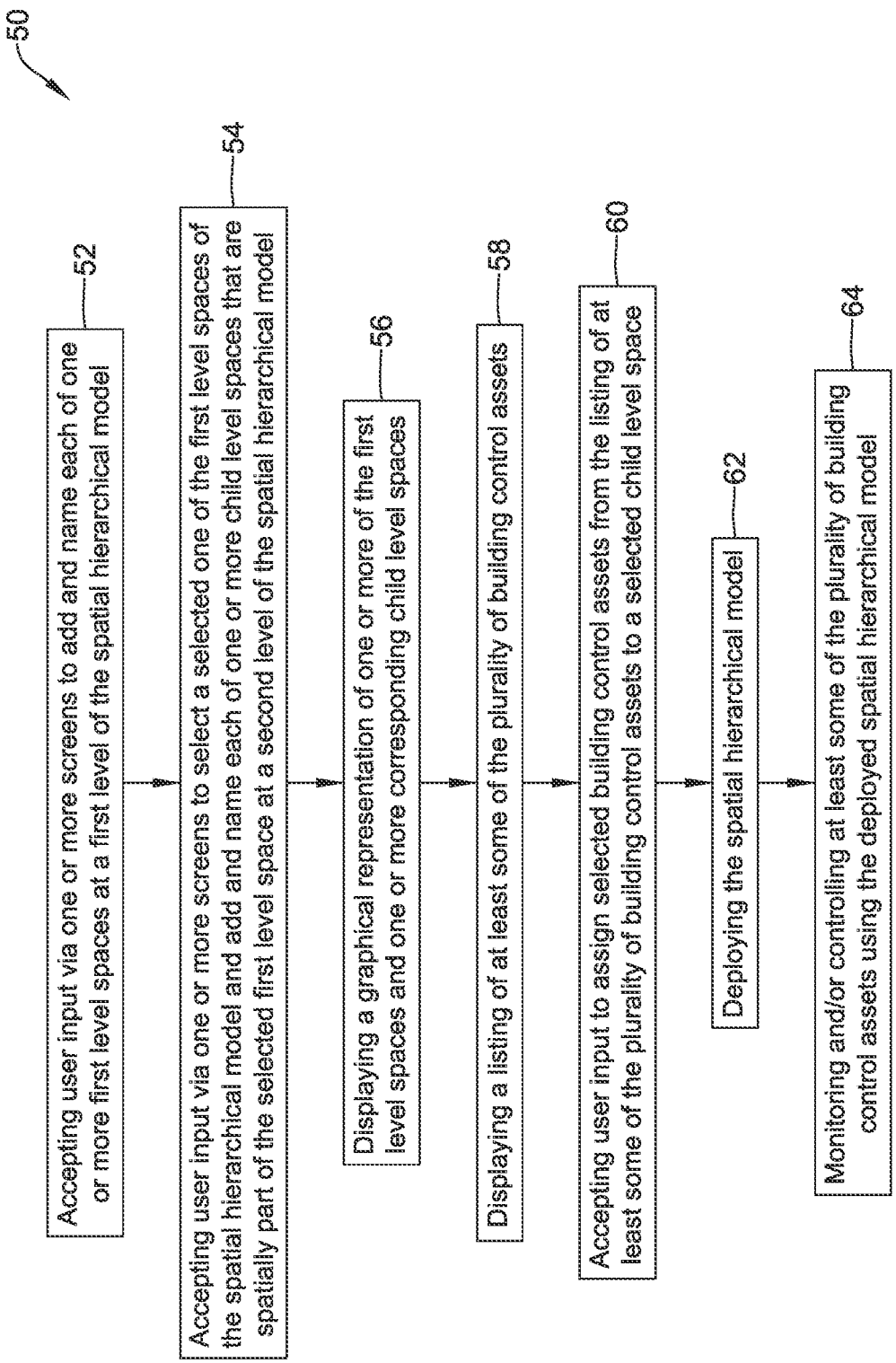
FIG. 4 is a flow diagram showing an illustrative method.

FIG. 4 is a flow diagram showing an illustrative method 50 of building a spatial hierarchical model (such as the spatial hierarchical model 30) of a plurality of building control assets (such as the building control assets 20), the spatial hierarchical model configured to provide spatial context of the plurality of building control assets to an operator when the operator is monitoring and/or controlling the plurality of building control assets. In some cases, at least some of the plurality of building control assets include video cameras. In some instances, at least some of the plurality of building control asserts include HVAC system assets. These are just examples.

The method 50 includes accepting user input via one or more screens to add and name each of one or more first level spaces at a first level of the spatial hierarchical model, as indicated at block 52. In some cases, accepting user input via one or more screens to add and name each of one or more first level spaces at the first level of the spatial hierarchical model may include accepting a selection of an add new space icon, displaying a pop-up menu in response to the selection of the add new space icon, and accepting a name for at least one of the one or more first level spaces. The word "space" here may be considered to be a generic term, and may refer to any of the hierarchical level objects referenced in FIG. 3. For example, the spaces may correspond to a region, a campus, a building and/or a space/zone within a building, to name a few.

User input is accepted via one or more screens to select a selected one of the first level spaces of the spatial hierarchical model and add and name each of one or more child level spaces that are spatially part of the selected first level space at a second level of the spatial hierarchical model, as indicated at block 54. In some cases, accepting user input via one or more screens to select the selected one of the first level spaces of the spatial hierarchical model and add and name each of one or more child level spaces that are spatially part of the selected first level space at the second level of the spatial hierarchical model may include accepting a selection of the selected one of the first level spaces, accepting a selection of an add new space icon, displaying a pop-up menu in response to the selection of the add new space icon, and accepting a name for at least one of the one or more child level spaces. A graphical representation of one or more of the first level spaces and one or more corresponding child level spaces is displayed, as indicated at block 56.

In the example shown, a listing of at least some of the plurality of building control assets is displayed, as indicated at block 58. User input is accepted to assign selected building control assets from the listing of at least some of the plurality of building control assets to a selected child level space, as indicated at block 60. In some instances, accepting user input to assign selected building control asserts to the selected child level may include dragging and dropping selected building control asserts from the listing of at least some of the plurality of building control asserts to the selected child level space. In some cases, the displayed listing of at least some of the plurality of building control assets may include building control assets that are already connected and visible on a building control network that is to be monitored and/or controlled using the spatial hierarchical model. In some cases, the displayed listing of at least some of the plurality of building control assets may include building control assets that are not yet connected and visible on the building control network that is to be monitored and/or controlled using the spatial hierarchical model. Displaying the list of at least some of the plurality of building control asserts may include filtering the plurality of building control asserts using filter criteria and displaying only the building control assets that meet the filter criteria. In some cases, the method 50 may include deploying the spatial hierarchical model, as indicated at block 62. The method 50 may include monitoring and/or controlling at least some of the plurality of building control assets using the deployed spatial hierarchical model, as indicated at block 64.

Figure 5:
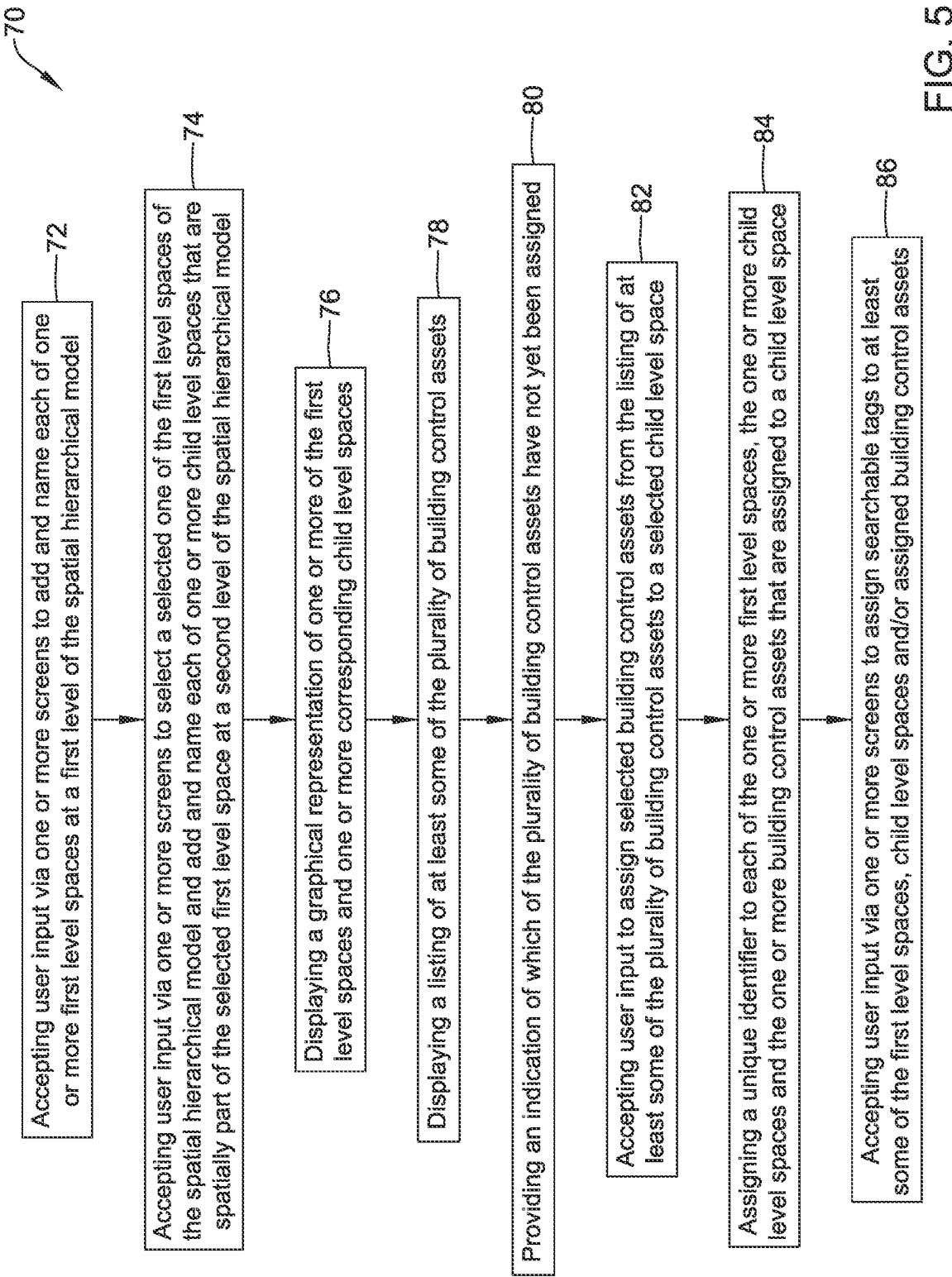
FIG. 5 is a flow diagram showing an illustrative method.

FIG. 5 is a flow diagram showing an illustrative method 70 of building a spatial hierarchical model (such as the spatial hierarchical model 30) of a plurality of building control assets (such as the building control assets 20), the spatial hierarchical model configured to provide spatial context of the plurality of building control assets to an operator when the operator is monitoring and/or controlling the plurality of building control assets. In some cases, at least some of the plurality of building control assets include video cameras. In some instances, at least some of the plurality of building control asserts include HVAC system assets. These are just examples. The illustrative method 70 includes accepting user input via one or more screens to add and name each of one or more first level spaces at a first level of the spatial hierarchical model, as indicated at block 72. In some cases, accepting user input via one or more screens to add and name each of one or more first level spaces at the first level of the spatial hierarchical model may include accepting a selection of an add new space icon, displaying a pop-up menu in response to the selection of the add new space icon, and accepting a name for at least one of the one or more first level spaces.

User input is accepted via one or more screens to select a selected one of the first level spaces of the spatial hierarchical model and add and name each of one or more child level spaces that are spatially part of the selected first level space at a second level of the spatial hierarchical model, as indicated at block 74. In some cases, accepting user input via one or more screens to select the selected one of the first level spaces of the spatial hierarchical model and add and name each of one or more child level spaces that are spatially part of the selected first level space at the second level of the spatial hierarchical model may include accepting a selection of the selected one of the first level spaces, accepting a selection of an add new space icon, displaying a pop-up menu in response to the selection of the add new space icon, and accepting a name for at least one of the one or more child level spaces. A graphical representation of one or more of the first level spaces and one or more corresponding child level spaces is displayed, as indicated at block 76.

In the example shown, a listing of at least some of the plurality of building control assets is displayed, as indicated at block 78. An indication of which of the plurality of building control assets have not yet been assigned may be displayed, as indicated at block 80. In some cases, the unassigned building control assets may be displayed in a different color, for example, or may be bolded relative to how the assigned building control assets are displayed. In some cases, only unassigned building control assets are displayed, while those that have already been assigned are not displayed in the listing.

User input is accepted to assign selected building control assets from the listing of at least some of the plurality of building control assets to a selected child level space, as indicated at block 82. In some instances, accepting user input to assign selected building control asserts to the selected child level may include dragging and dropping selected building control asserts from the listing of at least some of the plurality of building control asserts to the selected child level space. The displayed listing of at least some of the plurality of building control assets may include building control assets that are already connected and visible on a building control network that is to be monitored and/or controlled using the spatial hierarchical model. Displaying the list of at least some of the plurality of building control asserts may include filtering the plurality of building control asserts using filter criteria and displaying only the building control assets that meet the filter criteria.

In some instances, the method 70 may further include assigning a unique identifier to each of the one or more first level spaces, the one or more child level spaces and the one or more building control assets that are assigned to a child level space, as indicated at block 84. This may be done automatically without user input. In some cases, the method 70 may include accepting user input via one or more screens to assign searchable tags to at least some of the first level spaces, child level spaces and/or assigned building control assets, as indicated at block 86. The searchable tags may allow a user to categorize and/or group at least some of the first level spaces, child level spaces and/or assigned building control assets for later reference.

Figure 6:
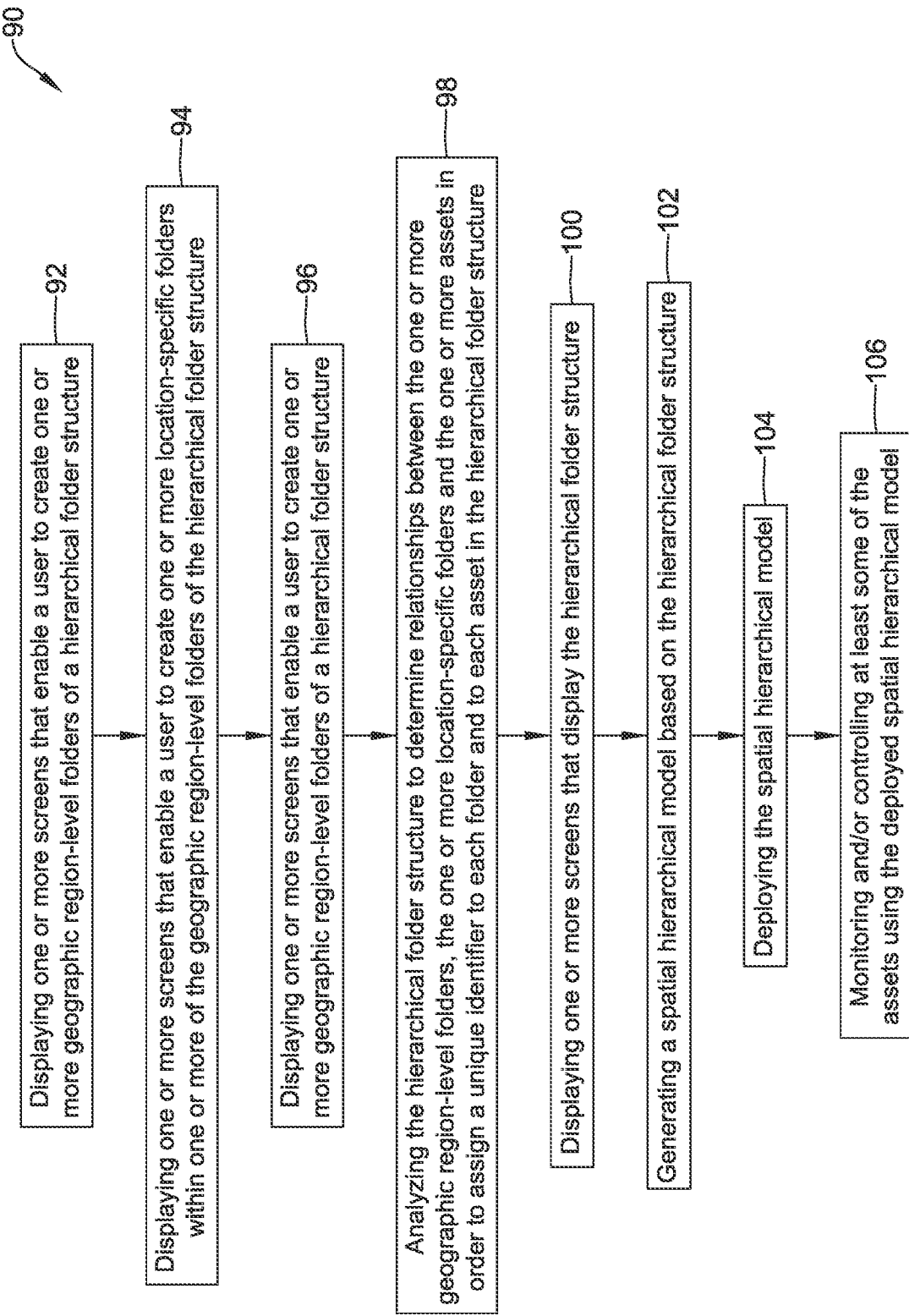
FIG. 6 is a flow diagram showing an illustrative method.

FIG. 6 is a flow diagram showing an illustrative method 90. The method 90 includes displaying one or more screens that enable a user to create one or more geographic region-level folders of a hierarchical folder structure, as indicated at block 92. One or more screens are displayed that enable a user to create one or more location-specific folders within one or more of the geographic region-level folders of the hierarchical folder structure, as indicated at block 94. The folders referenced here may be analogous to the various hierarchical level objects referenced in FIG. 3.

In the example shown, one or more screens are displayed that enable a user to dispose one or more assets within one or more folders of the hierarchical folder structure, as indicated at block 96. In some cases, the one or more screens that enable the user to dispose one or more assets within one or more folders of the hierarchical folder structure allow the user to drag and drop selected assets from a listing of available assets to a selected folder of the hierarchical folder structure. The hierarchical folder structure is analyzed to determine relationships between the one or more geographic region-level folders, the one or more location-specific folders and the one or more assets in order to assign a unique identifier to each folder and to each asset in the hierarchical folder structure, as indicated at block 98. One or more screens are displayed that display the hierarchical folder structure, as indicated at block 100.

In some cases, the method 90 may further include generating a spatial hierarchical model based on the hierarchical folder structure, as indicated at block 102. The spatial hierarchical model may be deployed, as indicated at block 104. At least some of the assets may be monitored and/or controlled using the deployed spatial hierarchical model, as indicated at block 106.

Figure 7:
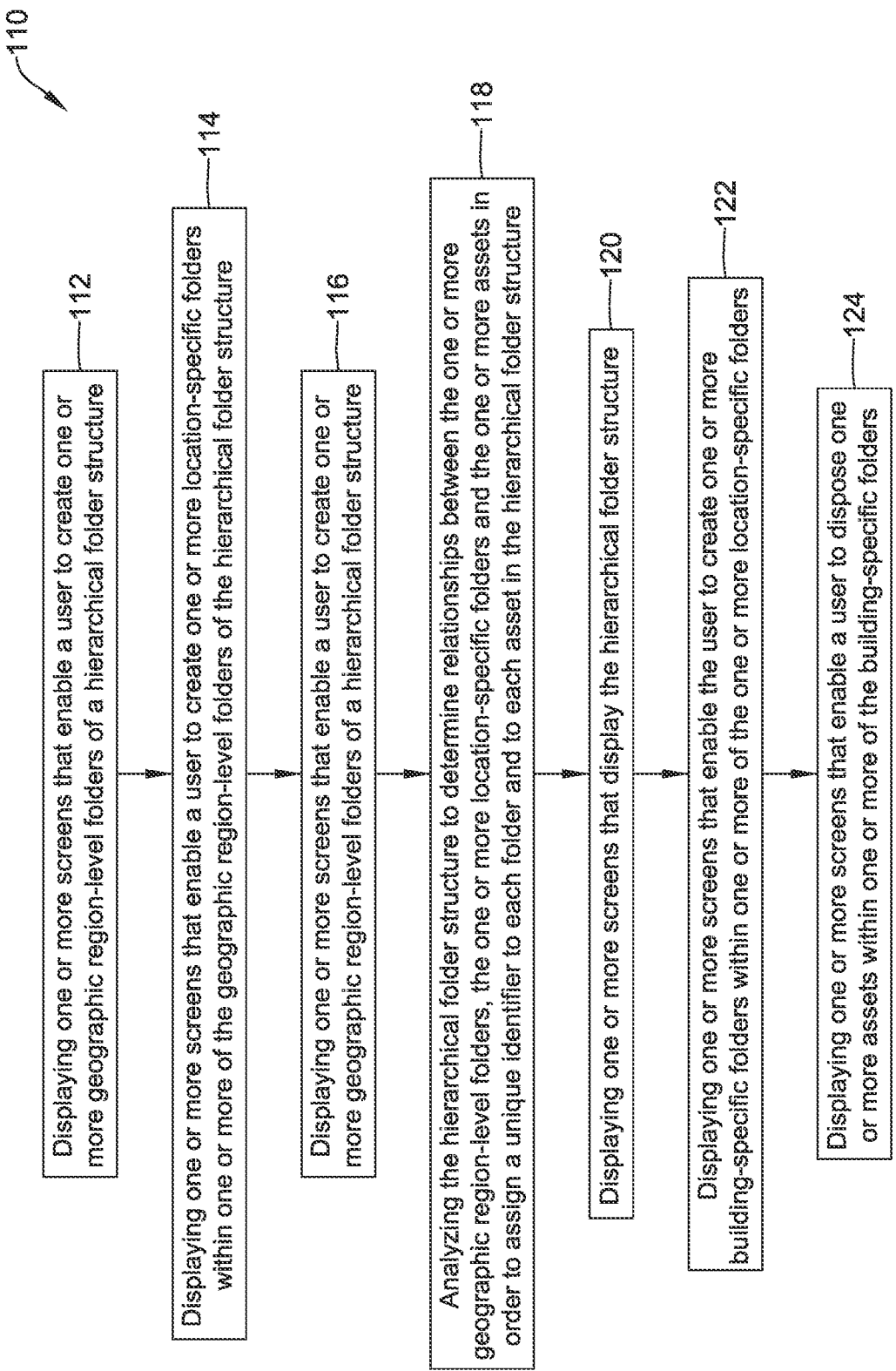
FIG. 7 is a flow diagram showing an illustrative method.

FIG. 7 is a flow diagram showing an illustrative method 110. The method 110 includes displaying one or more screens that enable a user to create one or more geographic region-level folders of a hierarchical folder structure, as indicated at block 112. One or more screens are displayed that enable a user to create one or more location-specific folders within one or more of the geographic region-level folders of the hierarchical folder structure, as indicated at block 114. One or more screens are displayed that enable a user to dispose one or more assets within one or more folders of the hierarchical folder structure, as indicated at block 116. In some cases, the one or more screens that enable the user to dispose one or more assets within one or more folders of the hierarchical folder structure allow the user to drag and drop selected assets from a listing of available assets to a selected folder of the hierarchical folder structure.

The hierarchical folder structure is analyzed to determine relationships between the one or more geographic region-level folders, the one or more location-specific folders and the one or more assets in order to assign a unique identifier to each folder and to each asset in the hierarchical folder structure, as indicated at block 118. This may be performed automatically without user input. In the example shown, one or more screens are displayed that display the hierarchical folder structure, as indicated at block 120. In some instances, the method 110 may further include displaying one or more screens that enable the user to create one or more building-specific folders within one or more of the one or more location-specific folders, as indicated at block 122. The illustrative method 110 may further include displaying one or more screens that enable a user to dispose one or more assets within one or more of the building-specific folders, as indicated at block 124.

Figure 8A:
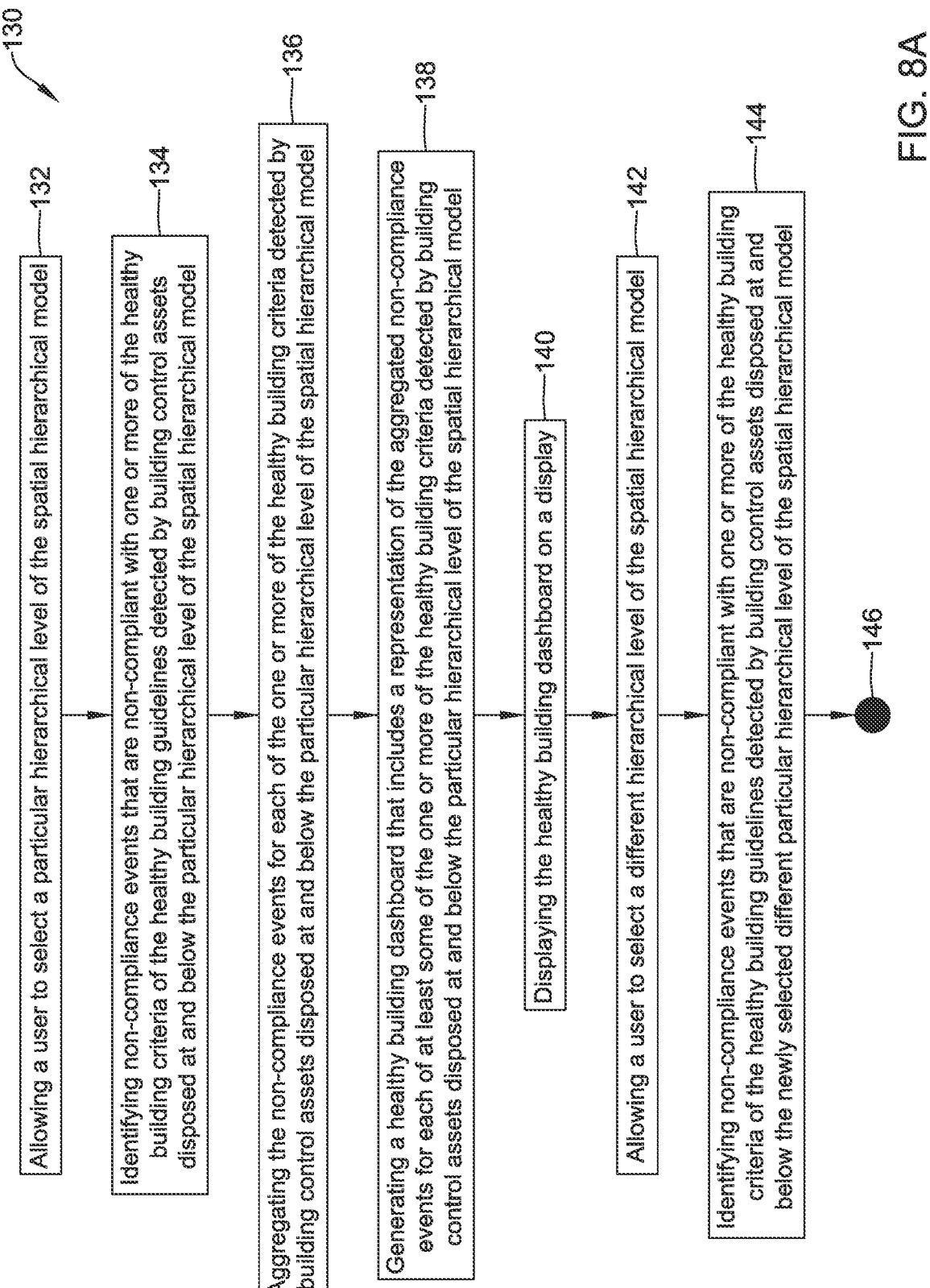
FIGS. 8A and 8B are flow diagrams that together show an illustrative method.
Figure 8B:
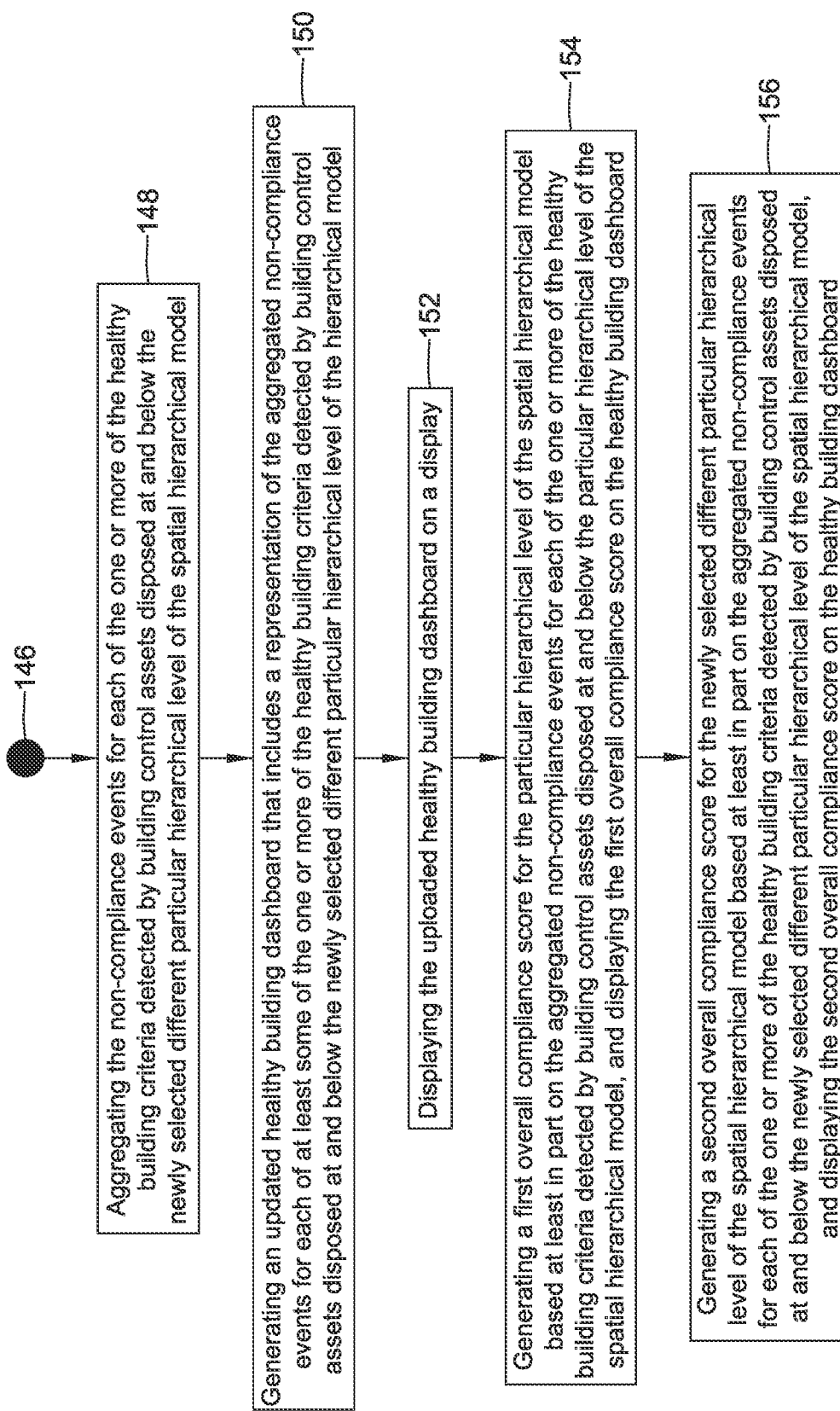

FIGS. 8A and 8B together provide a flow diagram showing an illustrative method 130 of monitoring compliance with healthy building guidelines using a spatial hierarchical model that provides spatial context to a plurality of building control assets disposed within a plurality of hierarchical levels of the spatial hierarchical model. The healthy building guidelines may be based at least in part on one or more healthy building criteria. The illustrative method 130 includes allowing a user to select a particular hierarchical level of the spatial hierarchical model, as indicated at block 132. Non-compliance events are identified that are non-compliant with one or more of the healthy building criteria of the healthy building guidelines detected by building control assets disposed at and below the particular hierarchical level of the spatial hierarchical model, as indicated at block 134.

The non-compliance events are aggregated for each of the one or more of the healthy building criteria detected by building control assets disposed at and below the particular hierarchical level of the spatial hierarchical model, as indicated at block 136. In some instances, aggregating the non-compliance events for each of the one or more of the healthy building criteria detected by building control assets disposed at and below the particular hierarchical level of the spatial hierarchical model may include separately aggregating the non-compliance events for each of the one or more of the healthy building criteria detected by building control assets disposed at and below the particular hierarchical level of the spatial hierarchical model over a period of time. The period of time may, for example, be user-selectable using a healthy building dashboard. A healthy building dashboard is generated that includes a representation of the aggregated non-compliance events for each of at least some of the one or more of the healthy building criteria detected by building control assets disposed at and below the particular hierarchical level of the spatial hierarchical model, as indicated at block 138. The healthy building dashboard is displayed on a display, as indicated at block 140. A user is allowed to select a different hierarchical level of the spatial hierarchical model, as indicated at block 142.

Non-compliance events are identified that are non-compliant with one or more of the healthy building criteria of the healthy building guidelines detected by building control assets disposed at and below the newly selected different particular hierarchical level of the spatial hierarchical model, as indicated at block 144. Control passes to an anchor 146, which is repeated at the top of FIG. 8B. The non-compliance events are aggregated for each of the one or more of the healthy building criteria detected by building control assets disposed at and below the newly selected different particular hierarchical level of the spatial hierarchical model, as indicated at block 148. Aggregating the non-compliance events for each of the one or more of the healthy building criteria detected by building control assets disposed at and below the newly selected different particular hierarchical level of the spatial hierarchical model may include separately aggregating the non-compliance events for each of the one or more of the healthy building criteria detected by building control assets disposed at and below the newly selected different particular hierarchical level of the spatial hierarchical model over a period of time. An updated healthy building dashboard is generated that includes a representation of the aggregated non-compliance events for each of at least some of the one or more of the healthy building criteria detected by building control assets disposed at and below the newly selected different particular hierarchical level of the spatial hierarchical model, as indicated at block 150. The updated healthy building dashboard is displayed on a display, as indicated at block 152.

In some instances, the method 130 may further include generating a first overall compliance score for the particular hierarchical level of the spatial hierarchical model based at least in part on the aggregated non-compliance events for each of the one or more of the healthy building criteria detected by building control assets disposed at and below the particular hierarchical level of the spatial hierarchical model, and displaying the first overall compliance score on the healthy building dashboard, as indicated at block 154. In some instances, the method 130 may further include generating a second overall compliance score for the newly selected different particular hierarchical level of the spatial hierarchical model based at least in part on the aggregated non-compliance events for each of the one or more of the healthy building criteria detected by building control assets disposed at and below the newly selected different particular hierarchical level of the spatial hierarchical model, and displaying the second overall compliance score on the updated healthy building dashboard, as indicated at block 156.

In some cases, one or more of the building control assets may include video cameras, and at least some of the non-compliance events that are non-compliant with one or more of the healthy building criteria of the healthy building guidelines may be detected by performing video analytics on video streams provided by one or more video cameras. The non-compliance events that are non-compliant with one or more of the healthy building criteria of the healthy building guidelines may include one or more of non-compliance occupancy levels, non-compliant social distancing behavior and/or non-compliance mask behavior. The one or more of the building control assets may include a temperature sensor, and at least one of the non-compliance events that are non-compliant with one or more of the healthy building criteria of the healthy building guidelines include a non-compliant space temperature. One or more of the building control assets may include a humidity sensor, and at least one of the non-compliance events that are non-compliant with one or more of the healthy building criteria of the healthy building guidelines may include a non-compliant space humidity. One or more of the building control assets may include a thermal sensor for sensing a body temperature of an occupant, and at least one of the non-compliance events that are non-compliant with one or more of the healthy building criteria of the healthy building guidelines may include a non-compliant body temperature.

Figure 9A:
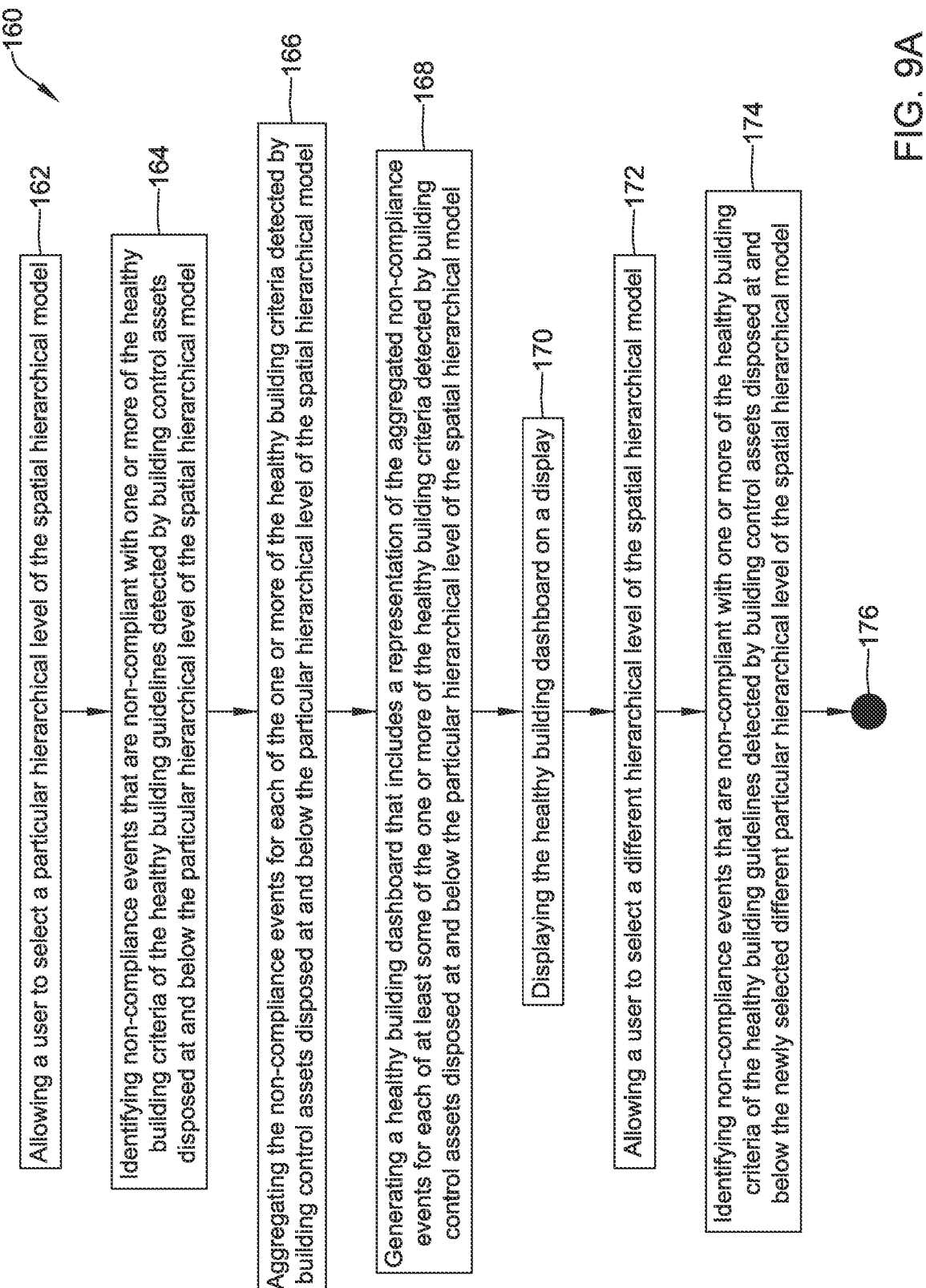

FIGS. 9A and 9B together provide a flow diagram showing an illustrative method 160 of monitoring compliance with healthy building guidelines using a spatial hierarchical model that provides spatial context to a plurality of building control assets disposed within a plurality of hierarchical levels of the spatial hierarchical model. The healthy building guidelines may be based at least in part on one or more healthy building criteria. The method 160 includes allowing a user to select a particular hierarchical level of the spatial hierarchical model, as indicated at block 162. Non-compliance events are identified that are non-compliant with one or more of the healthy building criteria of the healthy building guidelines detected by building control assets disposed at and below the particular hierarchical level of the spatial hierarchical model, as indicated at block 164.

In the example shown, the non-compliance events are aggregated for each of the one or more of the healthy building criteria detected by building control assets disposed at and below the particular hierarchical level of the spatial hierarchical model, as indicated at block 166. In some instances, aggregating the non-compliance events for each of the one or more of the healthy building criteria detected by building control assets disposed at and below the particular hierarchical level of the spatial hierarchical model may include separately aggregating the non-compliance events for each of the one or more of the healthy building criteria detected by building control assets disposed at and below the particular hierarchical level of the spatial hierarchical model over a period of time. The period of time may, for example, be user-selectable using a healthy building dashboard. A healthy building dashboard is generated that includes a representation of the aggregated non-compliance events for each of at least some of the one or more of the healthy building criteria detected by building control assets disposed at and below the particular hierarchical level of the spatial hierarchical model, as indicated at block 168. The healthy building dashboard is displayed on a display, as indicated at block 170. A user is allowed to select a different hierarchical level of the spatial hierarchical model, as indicated at block 172.

Non-compliance events are identified that are non-compliant with one or more of the healthy building criteria of the healthy building guidelines detected by building control assets disposed at and below the newly selected different particular hierarchical level of the spatial hierarchical model, as indicated at block 174. Control passes to an anchor 176, which is repeated at the top of FIG. 9B. The non-compliance events are aggregated for each of the one or more of the healthy building criteria detected by building control assets disposed at and below the newly selected different particular hierarchical level of the spatial hierarchical model, as indicated at block 178. Aggregating the non-compliance events for each of the one or more of the healthy building criteria detected by building control assets disposed at and below the newly selected different particular hierarchical level of the spatial hierarchical model may include separately aggregating the non-compliance events for each of the one or more of the healthy building criteria detected by building control assets disposed at and below the newly selected different particular hierarchical level of the spatial hierarchical model over a period of time. An updated healthy building dashboard is generated that includes a representation of the aggregated non-compliance events for each of at least some of the one or more of the healthy building criteria detected by building control assets disposed at and below the newly selected different particular hierarchical level of the spatial hierarchical model, as indicated at block 180. The updated healthy building dashboard is displayed on a display, as indicated at block 182.

In some instances, the method 160 may further include determining a non-compliance trend over a trend time period of the aggregated non-compliance events for each of at least some of the one or more of the healthy building criteria detected by building control assets disposed at and below the particular hierarchical level of the spatial hierarchical model, as indicated at block 184. In some instances, the trend time period may be user-selectable. The non-compliance trend may be displayed on the healthy building dashboard, as indicated at block 186. In some instances, the method 160 may further include displaying a plurality of recent non-compliance events on the healthy building dashboard, as indicated at block 188.

Figure 10A:
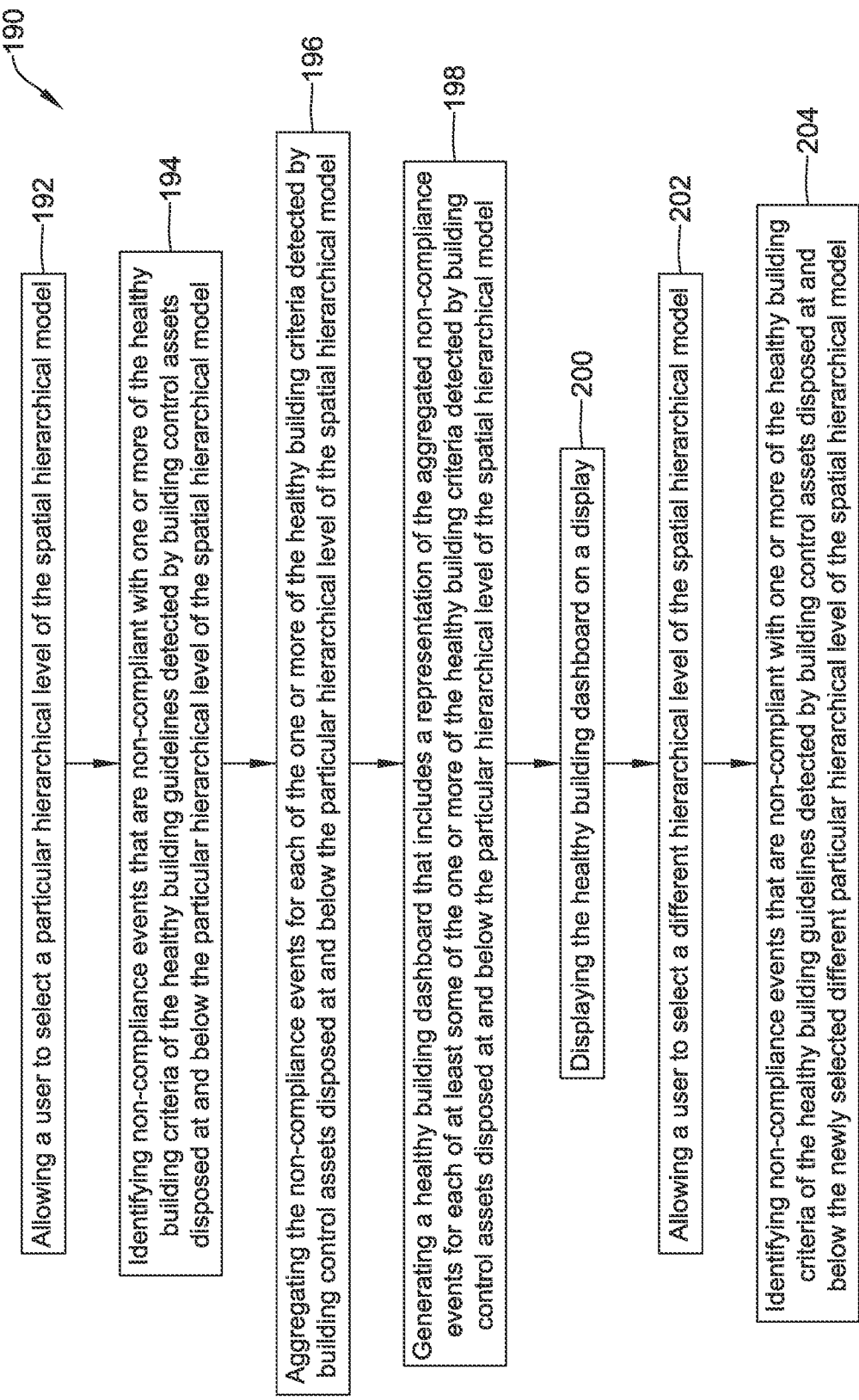
FIGS. 10A and 10B are flow diagrams that together show an illustrative method.
Figure 10B:
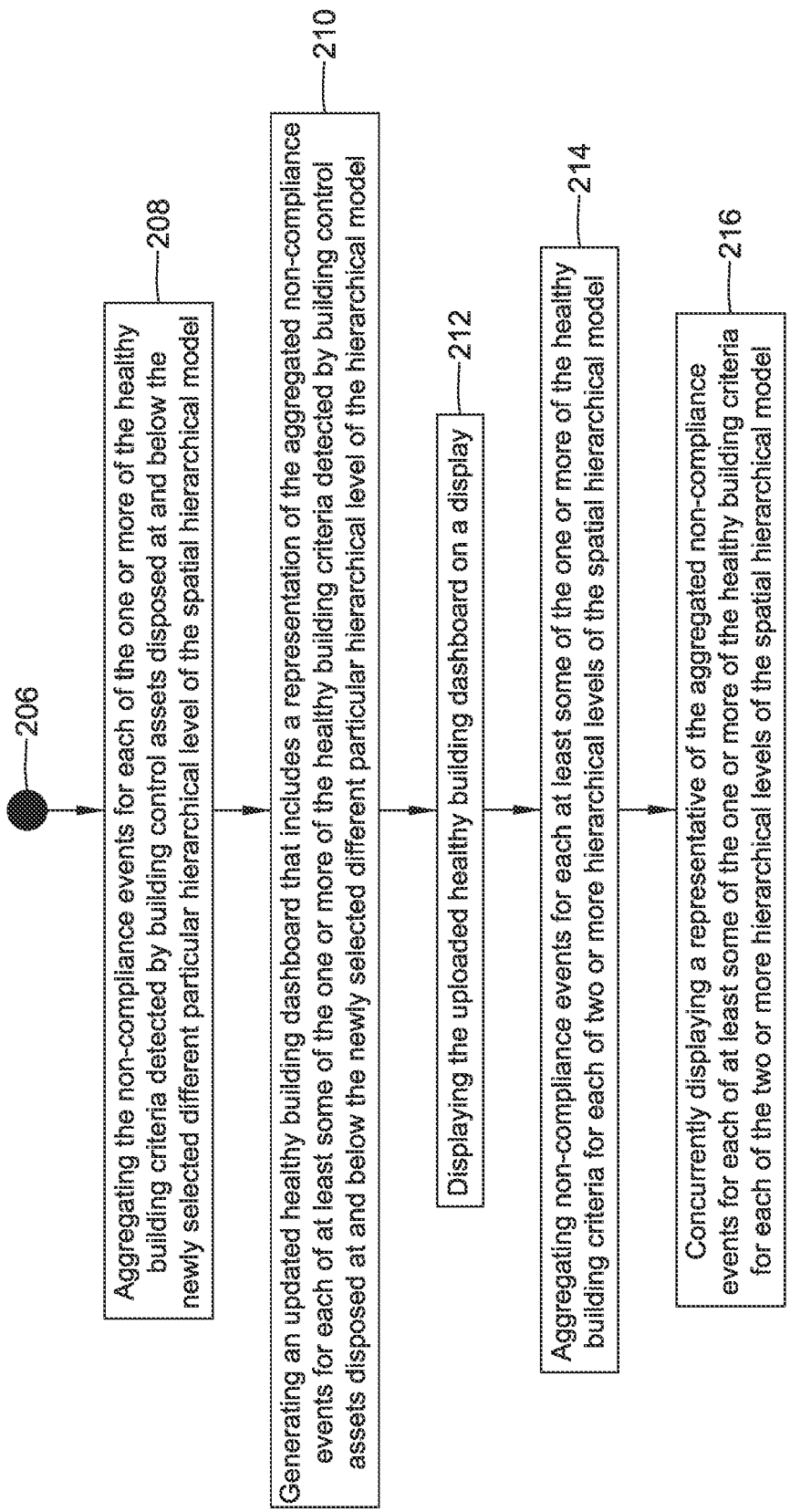

FIGS. 10A and 10B together provide a flow diagram showing an illustrative method 190 of monitoring compliance with healthy building guidelines within a spatial hierarchical model that provides spatial context to a plurality of building control assets disposed within a plurality of hierarchical levels of the spatial hierarchical model, the healthy building guidelines based at least in part on one or more healthy building criteria. The method 190 includes allowing a user to select a particular hierarchical level of the spatial hierarchical model, as indicated at block 192. Non-compliance events are identified that are non-compliant with one or more of the healthy building criteria of the healthy building guidelines detected by building control assets disposed at and below the particular hierarchical level of the spatial hierarchical model, as indicated at block 194.

The non-compliance events are aggregated for each of the one or more of the healthy building criteria detected by building control assets disposed at and below the particular hierarchical level of the spatial hierarchical model, as indicated at block 196. In some instances, aggregating the non-compliance events for each of the one or more of the healthy building criteria detected by building control assets disposed at and below the particular hierarchical level of the spatial hierarchical model may include separately aggregating the non-compliance events for each of the one or more of the healthy building criteria detected by building control assets disposed at and below the particular hierarchical level of the spatial hierarchical model over a period of time. The period of time may, for example, be user-selectable using a healthy building dashboard. A healthy building dashboard is generated that includes a representation of the aggregated non-compliance events for each of at least some of the one or more of the healthy building criteria detected by building control assets disposed at and below the particular hierarchical level of the spatial hierarchical model, as indicated at block 198. The healthy building dashboard is displayed on a display, as indicated at block 200. A user is allowed to select a different hierarchical level of the spatial hierarchical model, as indicated at block 202.

Non-compliance events are identified that are non-compliant with one or more of the healthy building criteria of the healthy building guidelines detected by building control assets disposed at and below the newly selected different particular hierarchical level of the spatial hierarchical model, as indicated at block 204. Control passes to an anchor 206, which is repeated at the top of FIG. 10B. The non-compliance events are aggregated for each of the one or more of the healthy building criteria detected by building control assets disposed at and below the newly selected different particular hierarchical level of the spatial hierarchical model, as indicated at block 208. Aggregating the non-compliance events for each of the one or more of the healthy building criteria detected by building control assets disposed at and below the newly selected different particular hierarchical level of the spatial hierarchical model may include separately aggregating the non-compliance events for each of the one or more of the healthy building criteria detected by building control assets disposed at and below the newly selected different particular hierarchical level of the spatial hierarchical model over a period of time. An updated healthy building dashboard is generated that includes a representation of the aggregated non-compliance events for each of at least some of the one or more of the healthy building criteria detected by building control assets disposed at and below the newly selected different particular hierarchical level of the spatial hierarchical model, as indicated at block 210. The updated healthy building dashboard is displayed on a display, as indicated at block 212.

In some instances, the method 190 further includes aggregating non-compliance events for each at least some of the one or more of the healthy building criteria for each of two or more hierarchical levels of the spatial hierarchical model, as indicated at block 214. In some instances, the method 190 may further include concurrently displaying a representation of the aggregated non-compliance events for each of at least some of the one or more of the healthy building criteria for each of the two or more hierarchical levels of the spatial hierarchical model, as indicated at block 216.

In some cases, the method 190 may further include forming the spatial hierarchical model. The spatial hierarchical model may be formed, as shown for example in FIGS. 4 through 7. As a particular example, the spatial hierarchical model may be formed by accepting user input via one or more screens to add and name each of one or more first level spaces at a first level of the spatial hierarchical model and accepting user input via one or more screens to select a selected one of the first level spaces of the spatial hierarchical model and add and name each of one or more child level spaces that are spatially part of the selected first level space at a second level of the spatial hierarchical model. A graphical representation may be displayed of one or more of the first level spaces and one or more corresponding child level spaces. A listing of at least some of the plurality of building control assets may be displayed. User input may be accepted to assign selected building control assets from the listing of at least some of the plurality of building control assets to a selected child level space.

In some instances, accepting user input to assign selected building control assets from the listing of at least some of the plurality of building control assets to the selected child level space may include dragging and dropping selected building control assets from the listing of at least some of the plurality of building control assets to the selected child level space. In some cases, accepting user input via one or more screens to add and name each of one or more first level spaces at the first level of the spatial hierarchical model may include accepting a selection of an add new space icon, displaying a pop-up menu in response to the selection of the add new space icon, and accepting a name for at least one of the one or more first level spaces.

Figure 11:
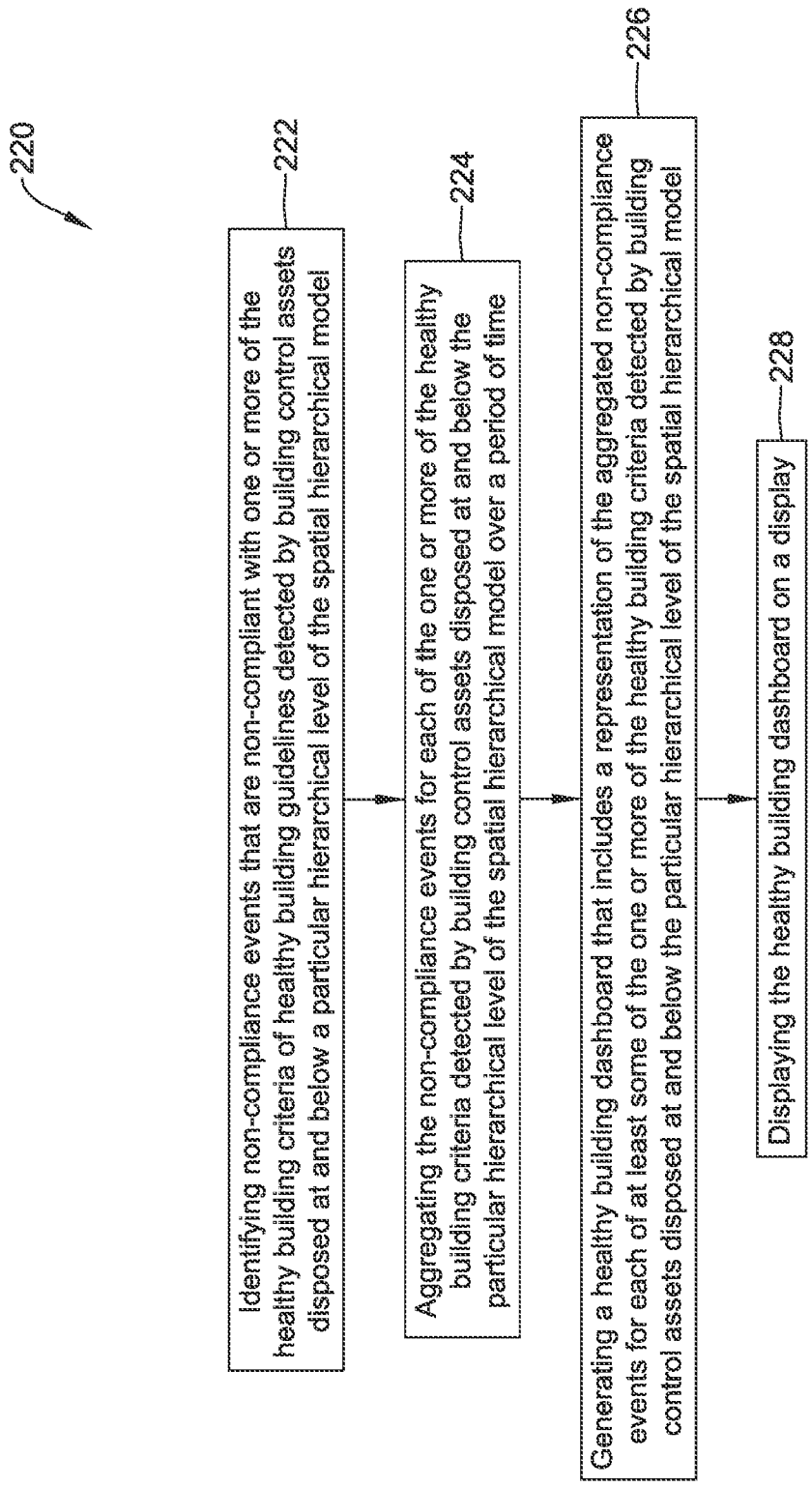
FIG. 11 is a flow diagram showing an illustrative method.

FIG. 11 is a flow diagram showing an illustrative method 220 of monitoring compliance with healthy building criteria within a spatial hierarchical model that provides spatial context to a plurality of building control assets disposed within a plurality of hierarchical levels of the spatial hierarchical model. The method 220 includes identifying non-compliance events that are non-compliant with one or more of the healthy building criteria of healthy building guidelines detected by building control assets disposed at and below a particular hierarchical level of the spatial hierarchical model, as indicated at block 222. The non-compliance events are aggregated for each of the one or more of the healthy building criteria detected by building control assets disposed at and below the particular hierarchical level of the spatial hierarchical model over a period of time, as indicated at block 224. A healthy building dashboard is generated that includes a representation of the aggregated non-compliance events for each of at least some of the one or more of the healthy building criteria detected by building control assets disposed at and below the particular hierarchical level of the spatial hierarchical model, as indicated at block 226. The healthy building dashboard is displayed on a display, as indicated at block 228. In some cases, the non-compliance events that are non-compliant with one or more of the healthy building criteria of the healthy building guidelines may include one or more of non-compliance occupancy levels, non-compliant social distancing behavior, non-compliance mask behavior and elevated body temperatures.

Figure 12:
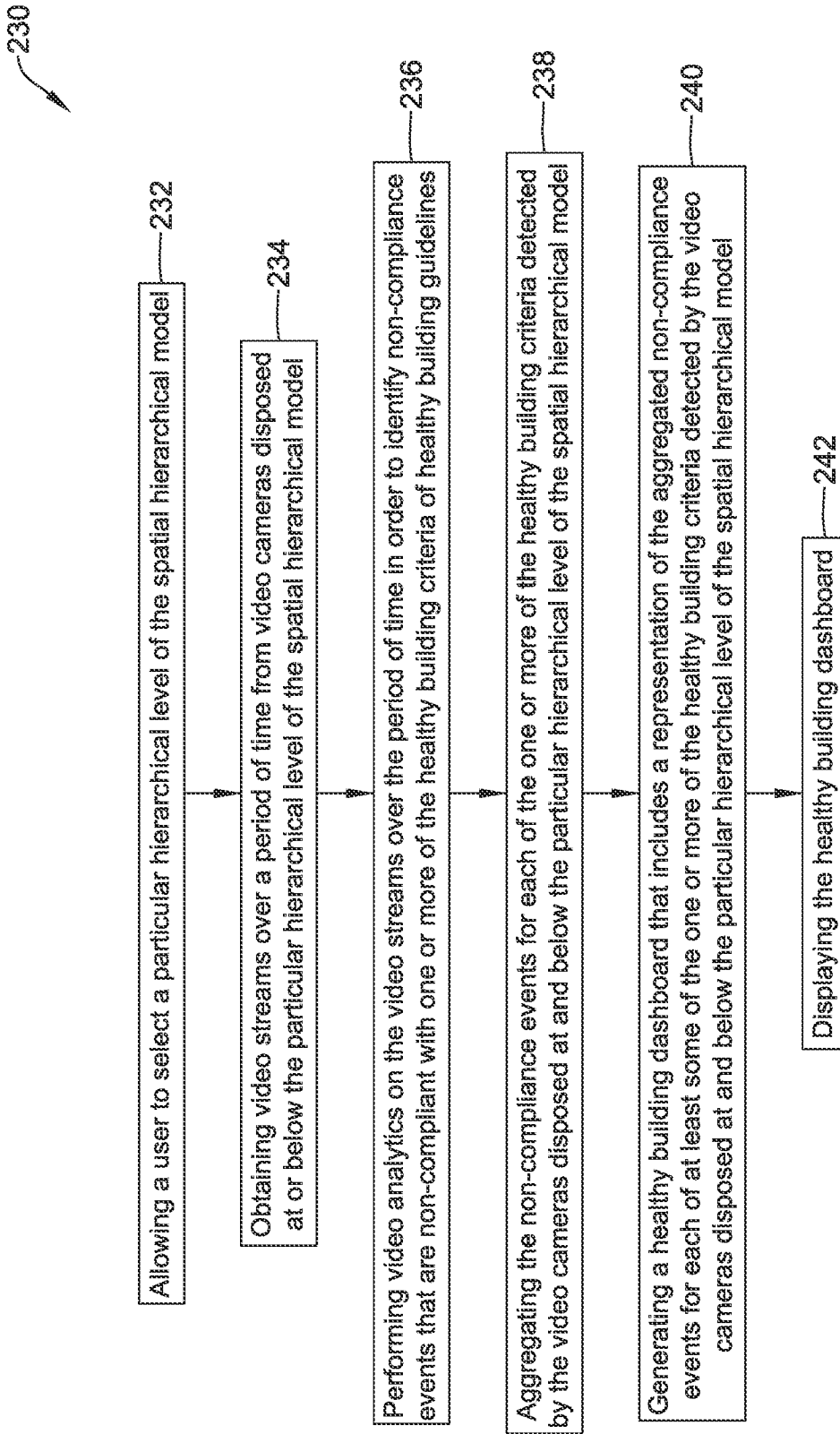
FIG. 12 is a flow diagram showing an illustrative method.

FIG. 12 is a flow diagram showing an illustrative method 230 of monitoring compliance with healthy building criteria within a spatial hierarchical model that provides spatial context to a plurality of building control assets disposed within a plurality of hierarchical levels of the spatial hierarchical model, at least some of the plurality of building control assets comprising video cameras. The method 230 includes allowing a user to select a particular hierarchical level of the spatial hierarchical model, as indicated at block 232. Video streams are obtained over a period of time from video cameras disposed at or below the particular hierarchical level of the spatial hierarchical model, as indicated at block 234. Video analytics are performed on the video streams over the period of time in order to identify non-compliance events that are non-compliant with one or more of the healthy building criteria of healthy building guidelines, as indicated at block 236.

The non-compliance events are aggregated for each of the one or more of the healthy building criteria detected by the video cameras disposed at and below the particular hierarchical level of the spatial hierarchical model, as indicated at block 238. A healthy building dashboard is generated that includes a representation of the aggregated non-compliance events for each of at least some of the one or more of the healthy building criteria detected by the video cameras disposed at and below the particular hierarchical level of the spatial hierarchical model, as indicated at block 240. The healthy building dashboard is displayed, as indicated at block 242.

Figure 13:
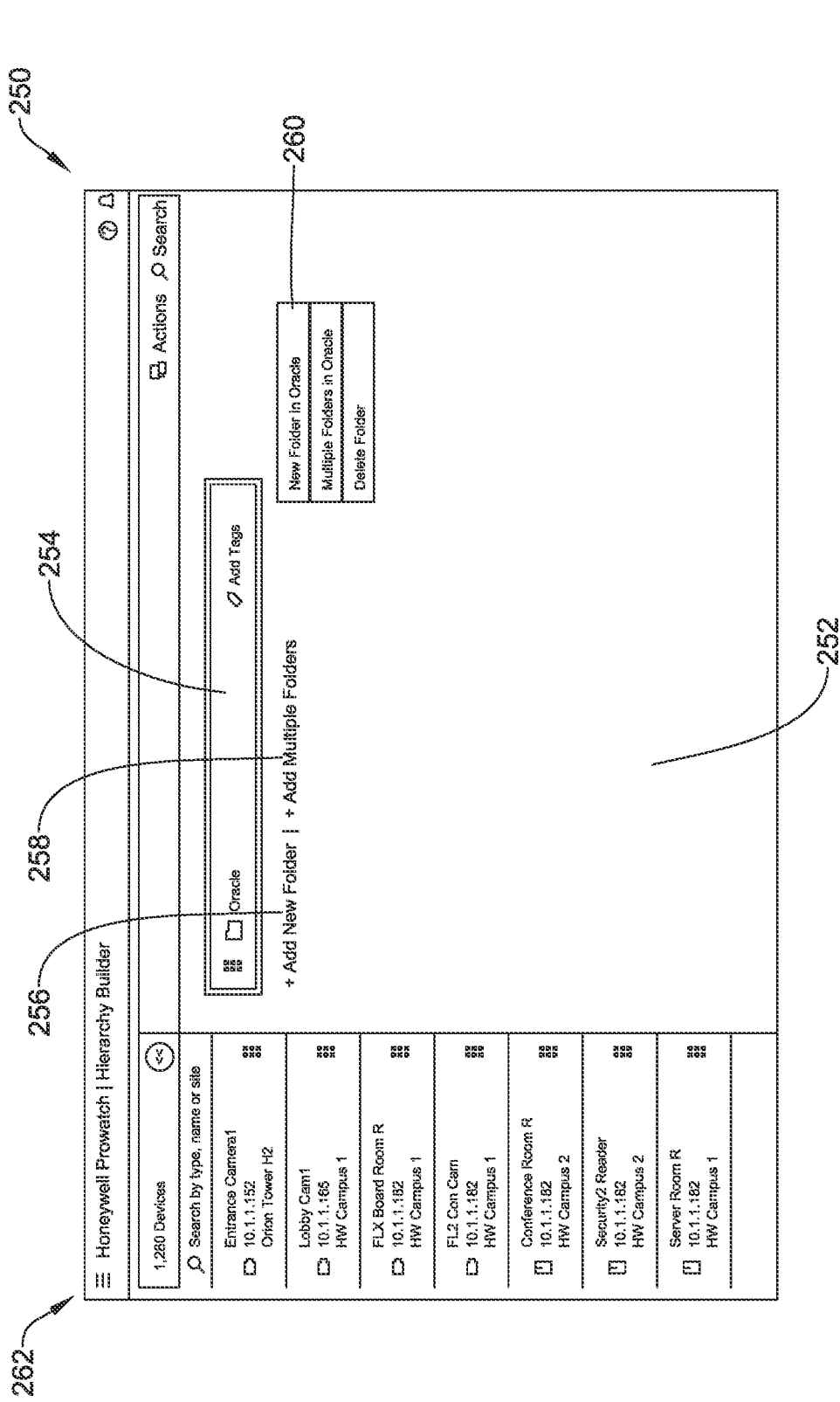
FIGS. 13 through 18 are screen shots showing an example method of creating a spatial hierarchical model.

FIGS. 13 through 18 are screen shots illustrating creation of a spatial hierarchical model. In FIG. 13, a screen 250 is seen. The screen 250 includes a workspace 252 on which a user can build a spatial hierarchical model in an intuitive way. As illustrated, a hierarchical level object 254 labeled "Oracle" has been created on the workspace 252. The hierarchical level object 254 is accompanied by an ADD NEW FOLDER button 256 and an ADD MULTIPLE NEW FOLDERS button 258. These options are duplicated in a pop-up menu 260, along with a delete folder option. In some cases, the pop-up menu 260 may appear as a result of the hierarchical level object 254 being selected. It can be seen that the hierarchical level object 254 is highlighted, meaning that the hierarchical level object 254 has been selected. The screen 250 also includes an asset list 262. As can be seen, each asset within the asset list 262 includes a name of the asset, an IP address and may include a current assignment of that particular asset. FIGS. 14 through 18 will show step-by-step an example of creating a spatial hierarchical model, beginning with the hierarchical level object 254.

Figure 14:
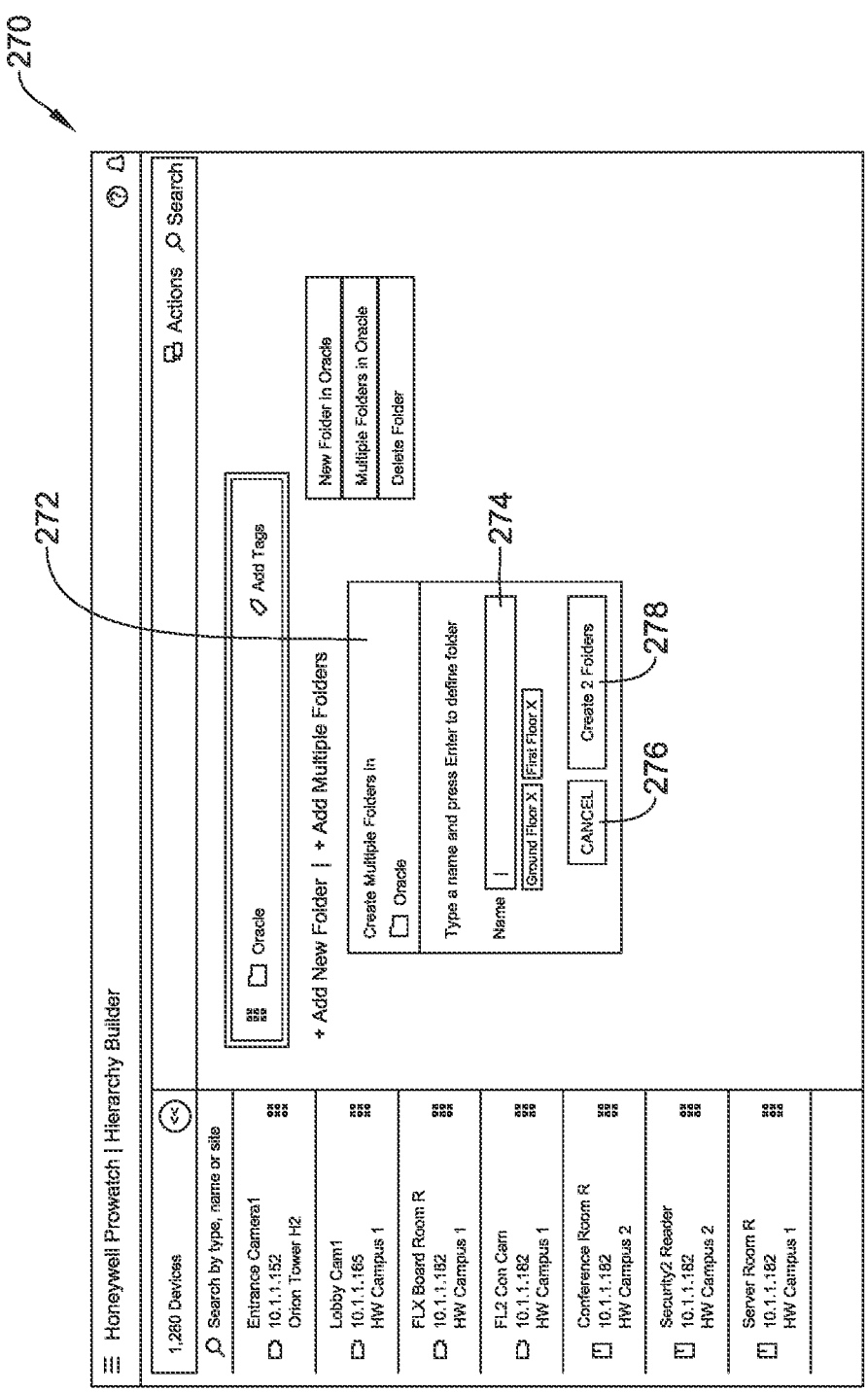

FIG. 14 shows a screen 270. The screen 270 is similar to the screen 250, but includes a pop-up box 272 that allows the user to create multiple new folders under the hierarchical level object 254. The rest of the screen 270, apart from the pop-up box 272, may be a grayed out version of the screen 250 to make it easier for the user to understand that they should be interacting with the pop-up box 272. The pop-up box 272 may appear as a result of the user having selected (with respect to FIG. 13) either the ADD MULTIPLE NEW FOLDERS button 258, or the appropriate option within the pop-up menu 260. It can be seen that the pop-up box 272 identifies the hierarchical level (hierarchical level 254, labeled "Oracle") in which the new folders will be placed. The pop-up box 272 includes a space 274 in which the user can type the name of a new folder. The user has already entered a new folder named "Ground Floor" and a new folder named "First Floor". The pop-up box 272 will allow a user to keep entering names of new folders to be created under the hierarchical level object 254 until the user either selects a CANCEL button 276 or selects a CREATE 2 FOLDERS button 278. It will be appreciated that the counter within the name of the button 278 will vary, depending on how many new folders are being created. It will be appreciated that a similar pop-up box may be displayed in response to the user having selected the ADD NEW FOLDER button 256 or the corresponding option within the pop-up menu 260, but would only be adding a single new folder.

Figure 15:
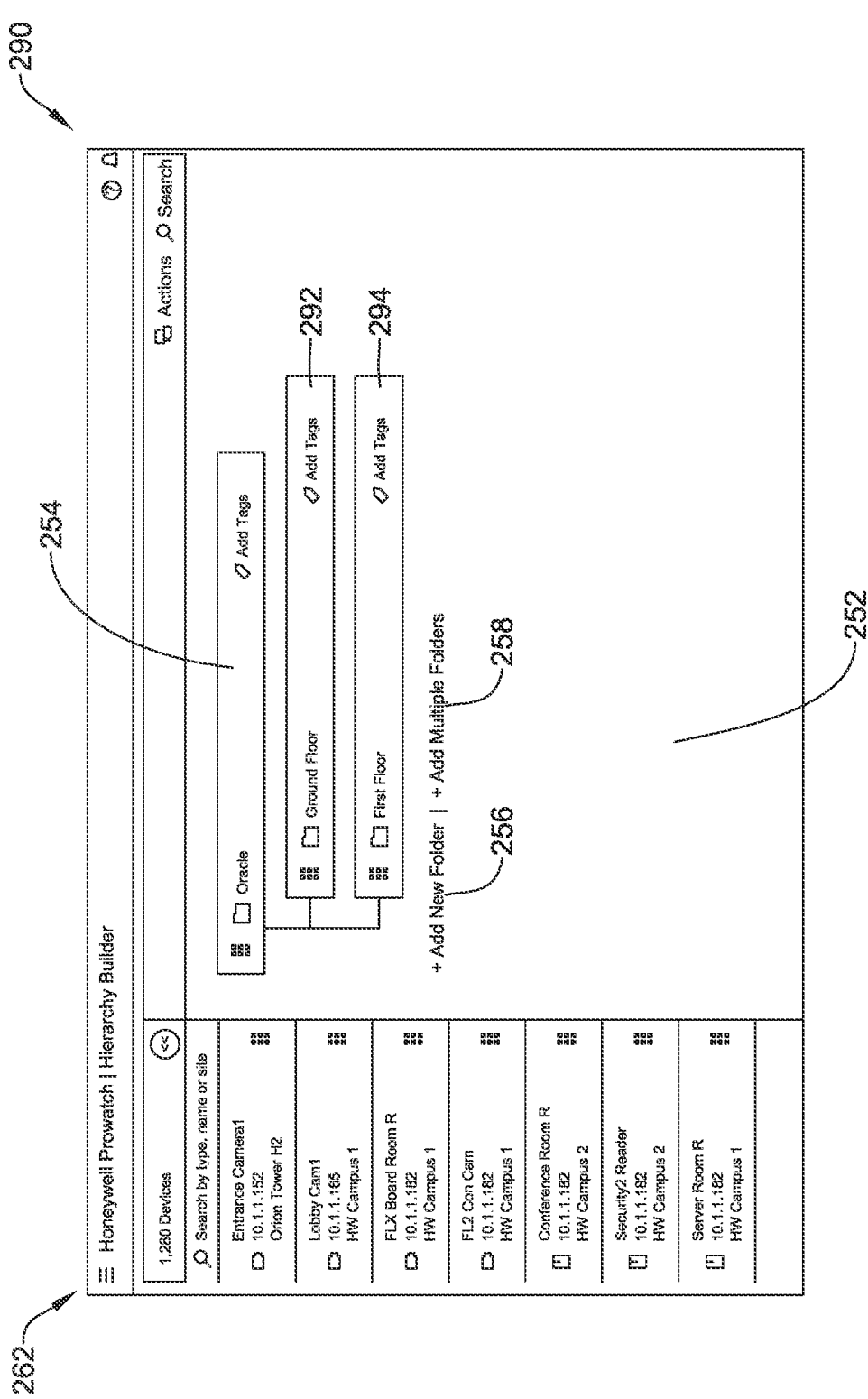

When the user selects the CREATE 2 FOLDERS button 278, a screen 290 will be displayed, as seen in FIG. 15. The screen 290 includes the hierarchical level object 254, but now also includes a hierarchical level object 292 labeled "Ground Floor" and a hierarchical level object 292 labeled "First Floor". It can be seen that the hierarchical level objects 292 and 294 are indented from the hierarchical level object 254, indicating that the hierarchical level objects 292 and 294 are child levels relative to the hierarchical level object 254, and the "Ground Floor" and the "First Floor" are both within the hierarchical level object labeled "Oracle". In this example, "Oracle" may be the name of a building.

Figure 16:
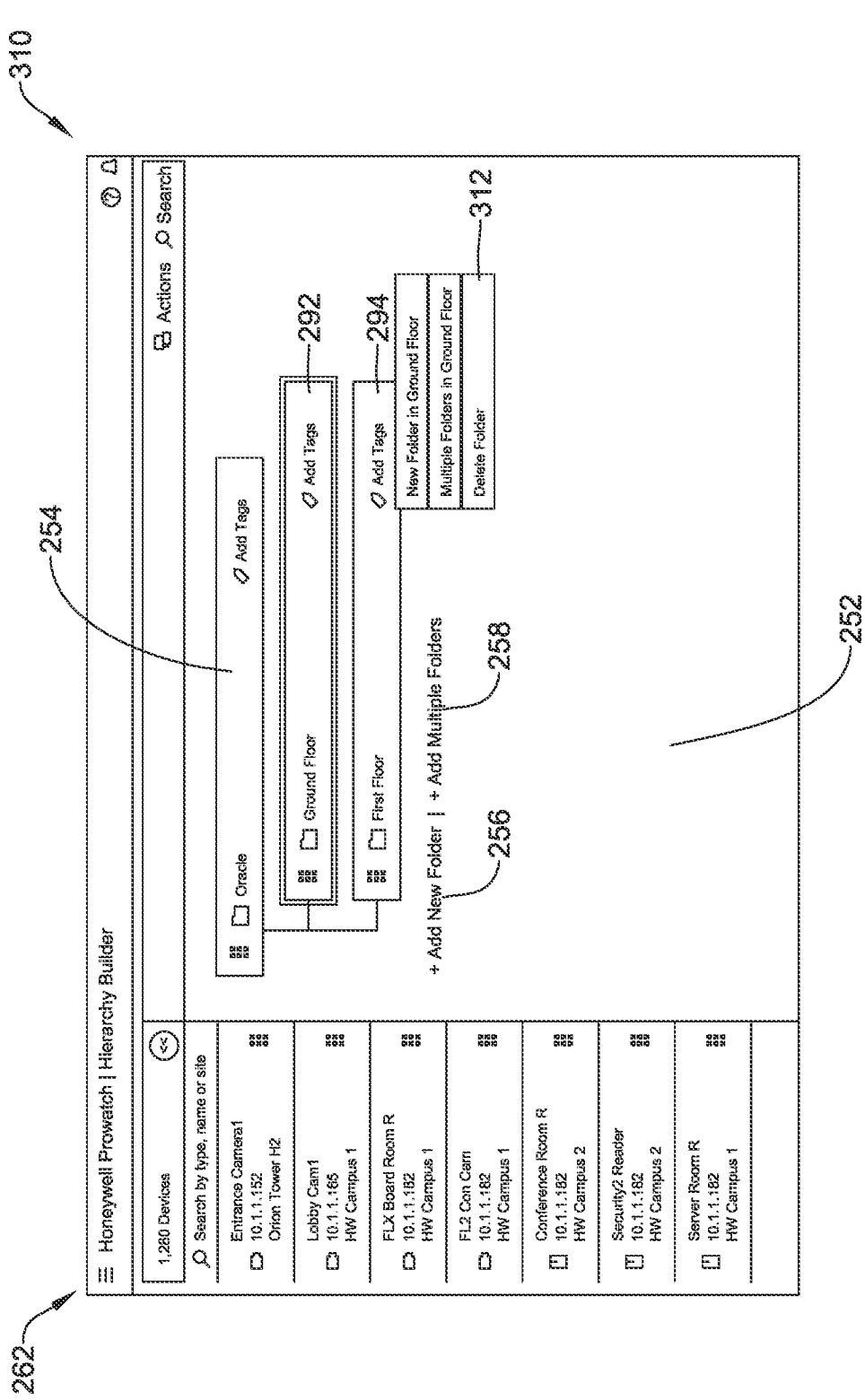

FIG. 16 shows a screen 310 that may be displayed as a result of the user selecting the hierarchical level object 292 labeled "Ground Floor" in the screen 290. It can be seen in FIG. 16 that the hierarchical level object 292 has been highlighted. As a result of the hierarchical level object 292 having been selected, a pop-up menu 312 has been displayed. The pop-up menu 312 includes options to create a New Folder in "Ground Floor", create Multiple Folders in "Ground Floor" or to delete a folder. Selecting Multiple Folders causes a screen 320 to be displayed, as seen in FIG. 17.

Figure 17:
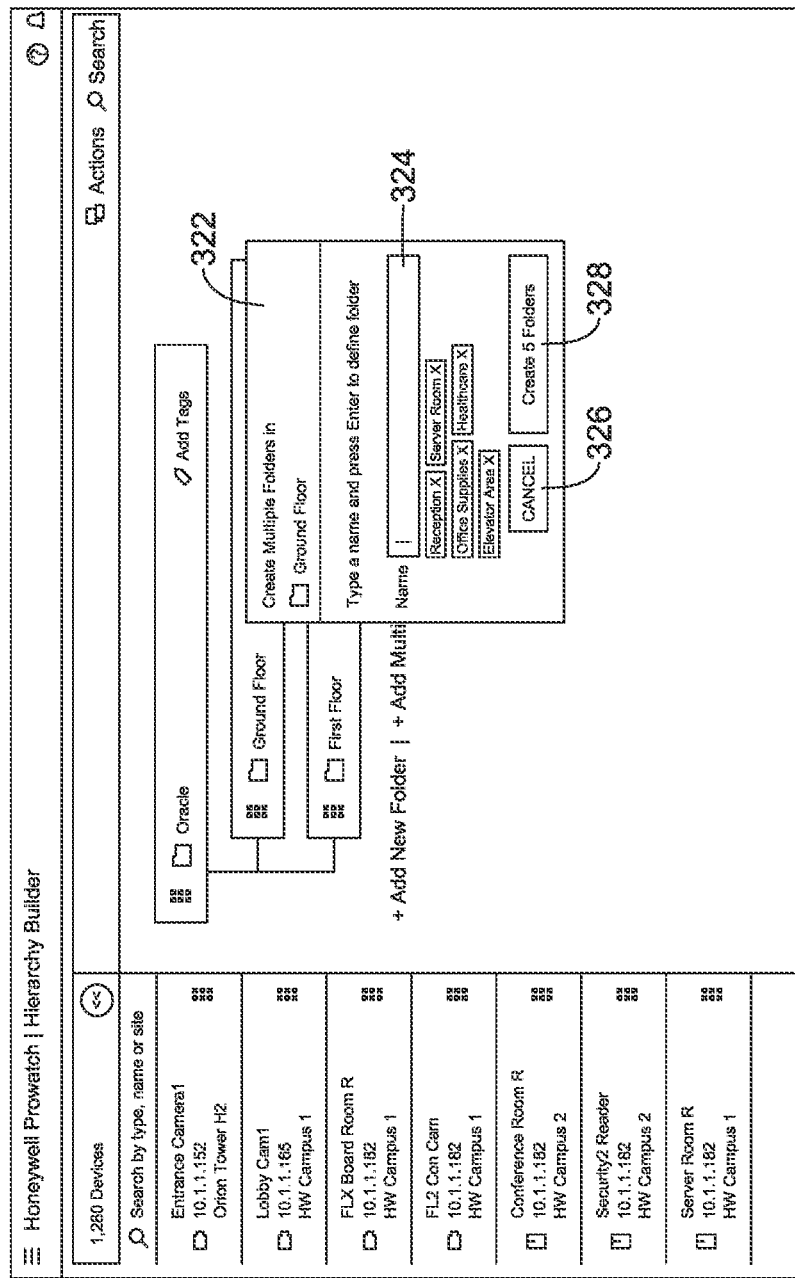

FIG. 17 shows the screen 320. The screen 320 is similar to the screen 310, but includes a pop-up box 322. In some cases, apart from the pop-up box 322, the screen 320 is the same as the screen 310 but everything excluding the pop-up box 322 is grayed out to make it easier for the user to understand that they should be interacting with the pop-up box 322.

Figure 18:
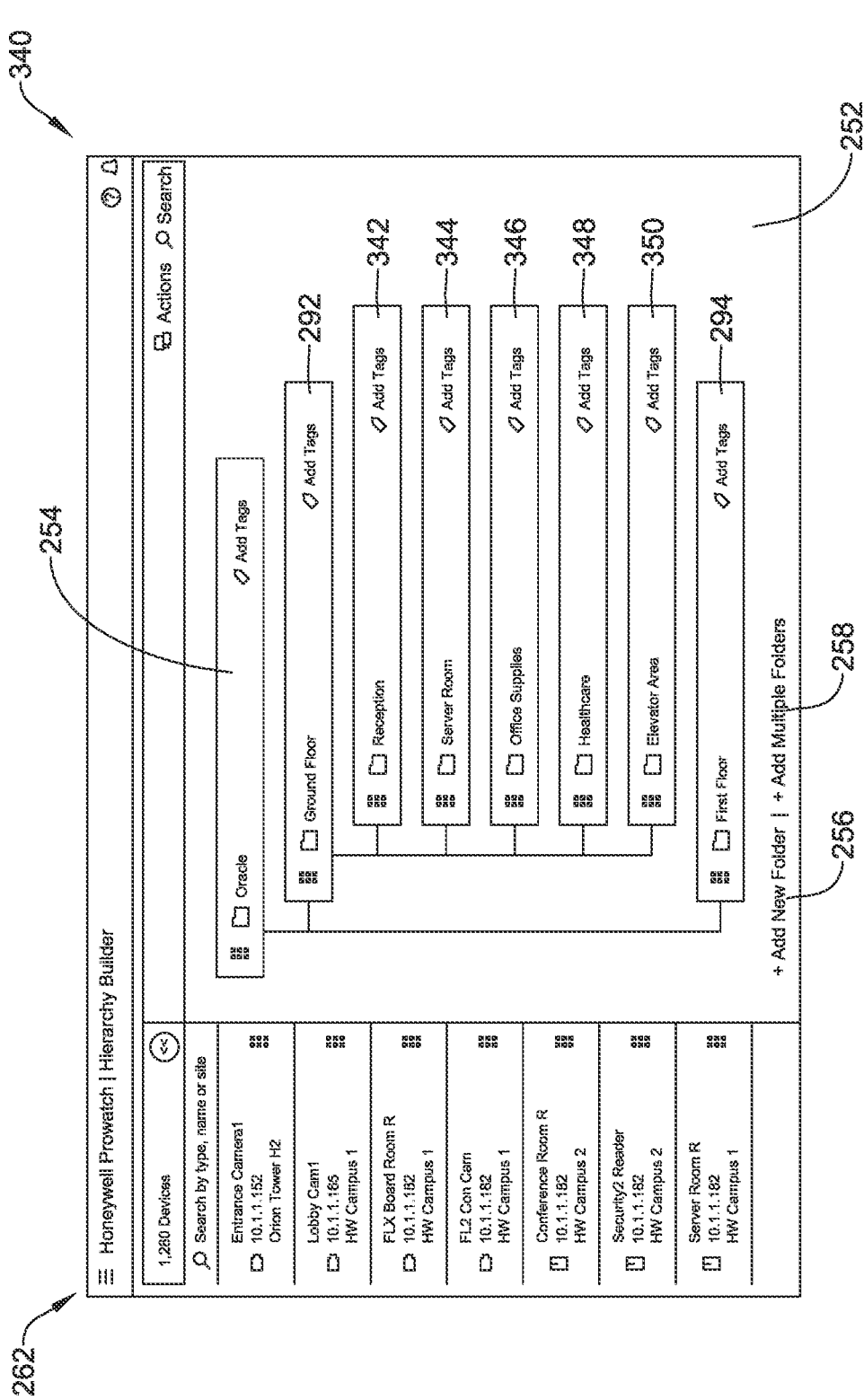

It can be seen that the pop-up box 322 identifies the hierarchical level (hierarchical level object 292, labeled "Ground Floor") in which the new folders will be placed. The pop-up box 322 includes a space 324 in which the user can type the name of a new folder. The user has already entered a new folder named "Reception", a new folder named "Server Room", a new folder named "Office Supplies", a new folder named "Healthcare" and a new folder named "Elevator Area". The pop-up box 322 will allow a user to keep entering names of new folders to be created under the hierarchical level object 292 until the user either selects a CANCEL button 326 or selects a CREATE 5 FOLDERS button 328. It will be appreciated that the counter within the name of the button 328 will vary, depending on how many new folders are being created. It will be appreciated that a similar pop-up box may be displayed in response to the user having selected the ADD NEW FOLDER button 256 or the corresponding option within the pop-up menu 312, but would only be adding a single new folder. Selecting the CREATE 5 FOLDERS button 328 will cause a screen 340 to be displayed, as seen in FIG. 18.

It can be seen that the spatial hierarchical model displayed within the workspace 252 has grown. The spatial hierarchical model still includes the hierarchical level object 254 labeled "Oracle", the hierarchical level object 292 labeled "Ground Floor" and the hierarchical level object 294 labeled "First Floor", but also includes additional hierarchical levels objects that are child levels relative to the hierarchical level object 292 and are grandchild levels relative to the hierarchical level object 254. These new hierarchical levels include a hierarchical level object 342 labeled "Reception", a hierarchical level object 344 labeled "Server Room", a hierarchical level object 346 labeled "Office Supplies", a hierarchical level object 348 labeled "Healthcare" and a hierarchical level object 350 labeled "Elevator Area". It will be appreciated that additional child hierarchical level objects may be created relative to the hierarchical level object 294 labeled "First Floor", and that additional hierarchical level object may be added relative to the hierarchical level object 254 labeled "Oracle" such as "Second Floor", "Third Floor and so on, or perhaps Parking Garage.

Figure 19:
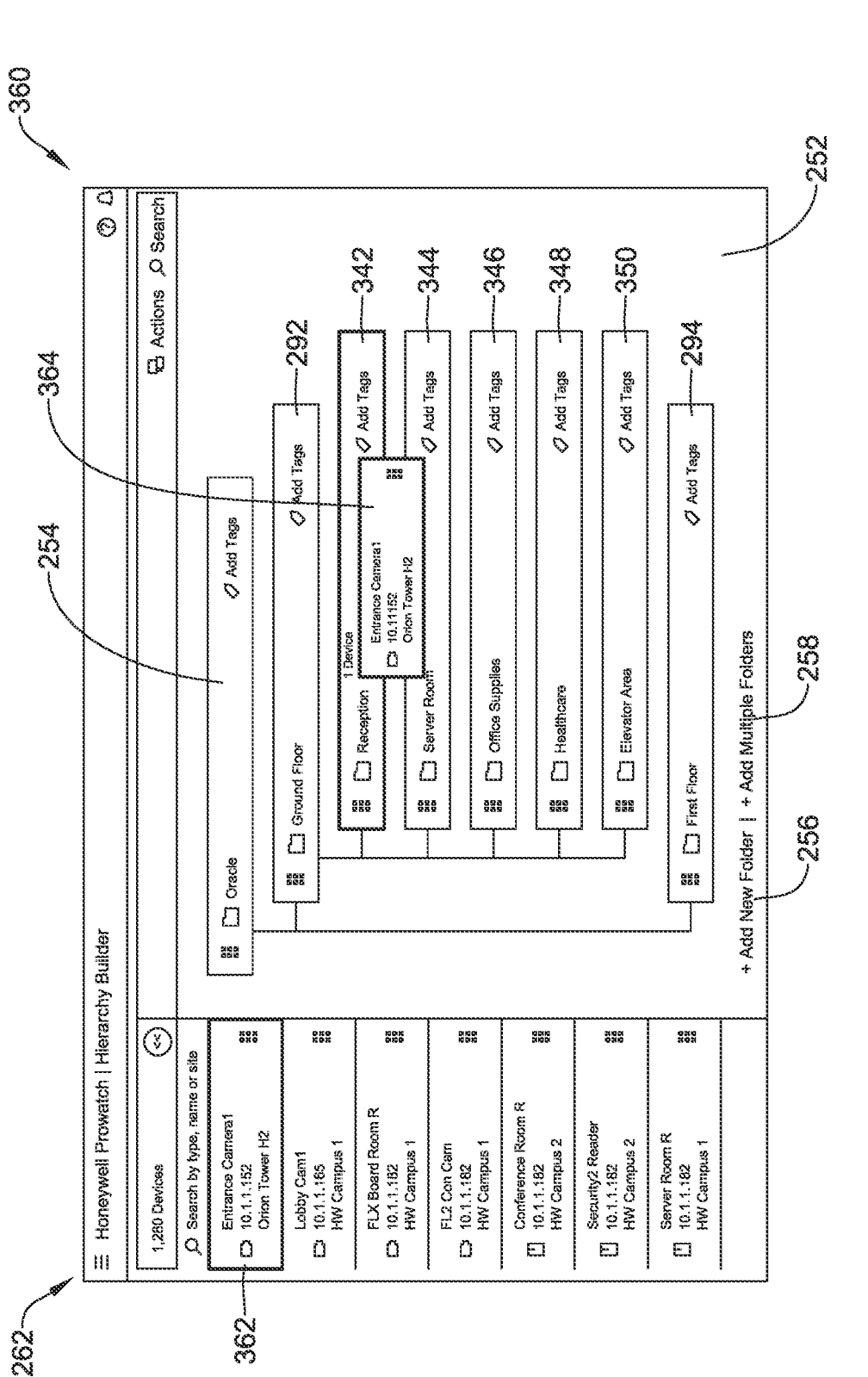
FIG. 19 is a screen shot showing an example method of assigning an asset to a particular level of the spatial hierarchical model created in FIGS. 13 through 18.

FIG. 19 shows an illustrative screen 360 that illustrates assigning an asset to a particular level of the spatial hierarchical model created in FIGS. 13 through 18. In this example, an asset 362, which is included in the asset list 262, is being assigned to the hierarchical level object 342 labeled "Reception Area". This may be achieved by dragging the asset 362 from the asset list 262 and dropping the asset 362 onto the desired hierarchical level, which in this case is the hierarchical level object 342. A pop-up box 364 identifies the asset 362, which serves as a double check that the correct asset has been assigned to the desired hierarchical level object. The asset 362 is also highlighted within the asset list 262 and the target hierarchical level object 342 is also highlighted. It will be appreciated that this process may be repeated until all desired assets have been properly assigned to the appropriate hierarchical level object. As the spatial hierarchical model is built up in this manner, a powerful tool is created that allows a user to capture global information while also being able to drill down to particular hierarchical levels or even particular installed and assigned assets.

Figure 20:
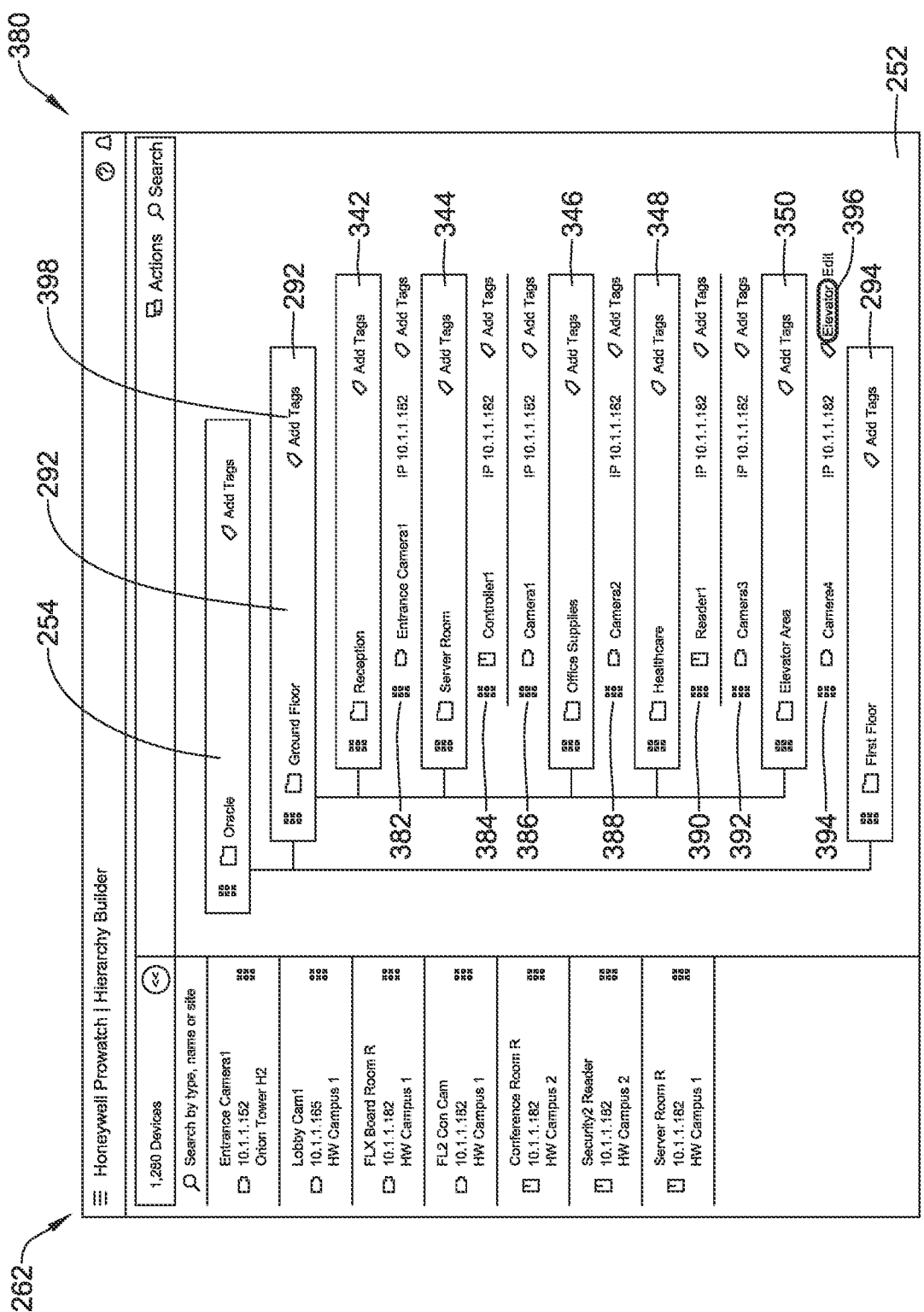
FIGS. 20 and 21 are screen shots showing an example method of assigning a tag to a particular feature of the spatial hierarchical model created in FIGS. 13 through 18.

FIG. 20 provides an example in which additional assets have been assigned. The spatial hierarchical model includes the same hierarchical level objects 254, 292, 294, 442, 344, 346, 348 and 350 as shown in previous Figures. An Entrance Camera 382 has been assigned to the hierarchical level object 342 labeled "Reception". A Controller 384 and a Camera 386 have been assigned to the hierarchical level object 344 labeled "Server Room". A Camera 388 has been assigned to the hierarchical level object 346 labeled "Office Supplies". A Reader 390 and a Camera 392 have been assigned to the hierarchical level object 348 labeled "Healthcare". A Camera 394 has been assigned to the hierarchical level object 350 labeled "Elevator Area".

Once a spatial hierarchical model has been created and put into use, a user may have a desire to search within the spatial hierarchical model. Searches and/or filtering can be performed using the names or portions of names of the hierarchical level objects, for example. As an example, perhaps a user wants to see the assets assigned to every "Reception" area in the company, spread over multiple buildings in multiple geographic regions. The user could search and/or filter search results for "reception" to obtain this information. Searches and/or filtering may be performed using the names or portions of names of the assets that are assigned to the various hierarchical level objects. For example, a user could decide they want to see the location of every door access device in the building. They could search for "door access" or "card reader" or something similar, for example.

Another way that the user can search and/or filter search results is to use what can be referred to as tags. With reference to the FIGS. 13 through 20, it can be seen that each displayed hierarchical level object 254, 292, 294, 442, 344, 346, 348 and 350 includes an "Add Tags" icon as part of the displayed hierarchical level object. With particular reference to FIG. 20, it can be seen that the Camera 394, which is under the hierarchical level object 350, includes a tag 396 that reads "Elevator". This provides a user an easy way to find all assets that are associated with an elevator, for example. In FIG. 20, it can be seen that the hierarchical level object 292 labeled "Ground Floor" includes an Add Tags icon 398. Actually, each of the displayed hierarchical level objects and assigned assets include an Add Tags icon 398, although for simplicity each Add Tags icon 398 is not labeled. Selecting one of the "Add Tags" icon 398 may cause a screen 400 to be displayed, as seen in FIG. 21.

Figure 21:
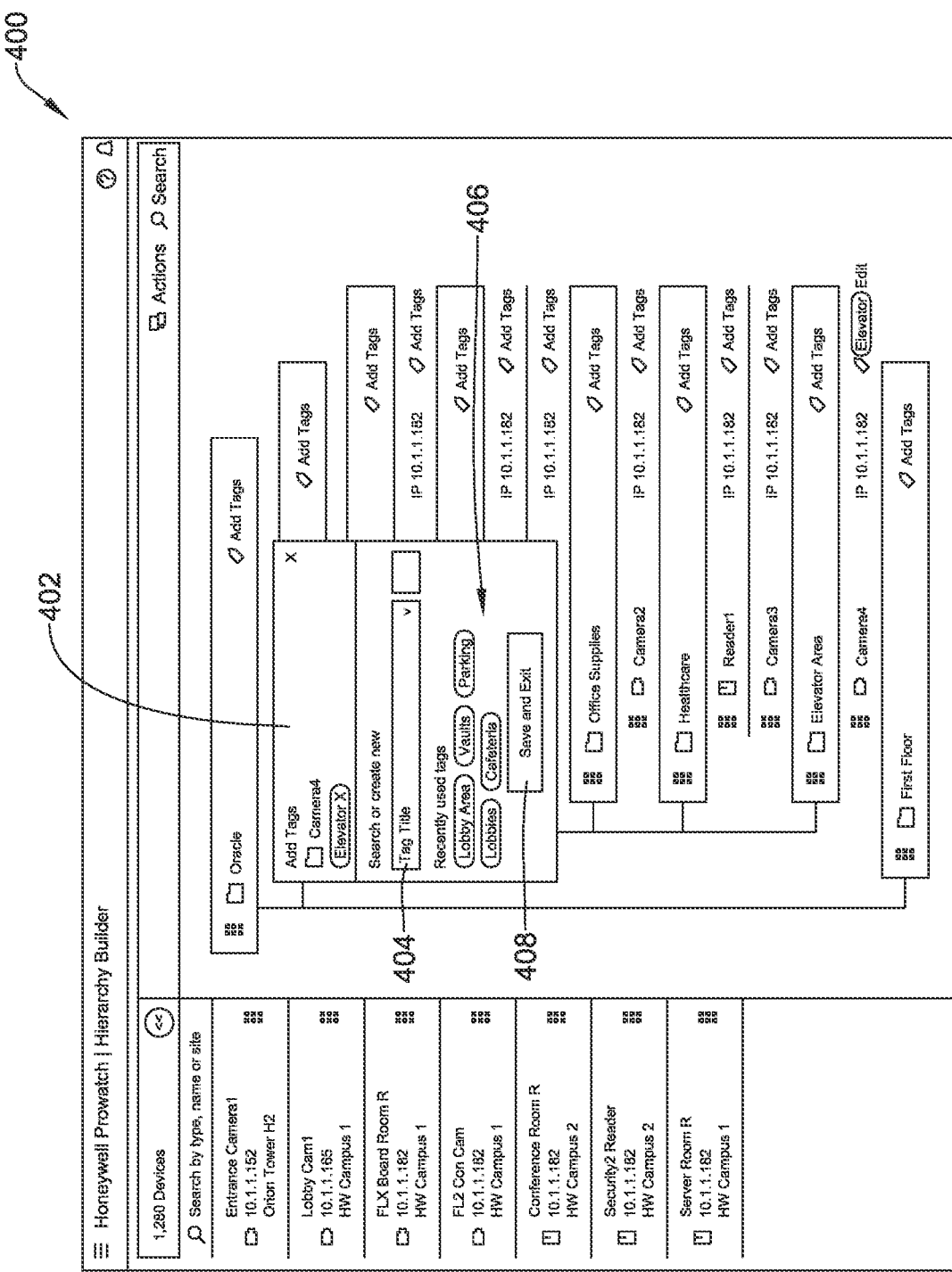

FIG. 21 provides a screen 400 that is similar to the screen 380, but includes a pop-up box 402 that can be used to add a tag. A tag can be added that has already been used, or a tag can be newly created. The pop-up box 402 includes a box 404 that allows the user to enter the name of a tag they wish to assign to the particular hierarchical level object or assigned asset. The pop-up box 402 includes a listing 406 of recently used tags, which allows the user to easily select one of those tags, rather than having to retype the name into the box 404. The pop-up box 402 also includes a SAVE AND EXIT button 408, which when selected causes the new tag and its association with a hierarchical level object or an assigned asset. It will be appreciated that the pop-box 402 demonstrates creation and assignment of the tag 396 that reads "Elevator" in FIG. 20.

FIG. 22 is a screen shot providing a screen 420 that shows the spatial hierarchy model created in FIGS. 13 through 18 displayed in a tabular format. The screen 420 shows a portion of a spreadsheet that may be displayable using various software such as but not limited to Microsoft Excel, Apple Numbers, Google Sheets, Quip, EtherCalc, Zoho Sheets, LibreOffice, Apache OpenOffice Calc, Smartsheet and Airtable, among others. FIG. 22 provides an example displayed using Microsoft Excel, but of course other spreadsheet software or the like may be utilized as desired.

The screen 420 shows a number of columns, including a Type column 422, a Name column 424, a Parent column 426, a Device Type column 428, an IP column 430, and a Tag1 column 432. It will be appreciated that the screen 420 includes the same information regarding the spatial hierarchy model as does FIGS. 13 through 18, but simply in a different format. Row 434 of the spreadsheet has a Type of Folder and a name "Oracle". This corresponds to the hierarchical level object 254 labeled "Oracle". Row 436 has a Type of Folder, a name "Ground Floor and a parent of "Oracle". This corresponds to the hierarchical level object 292 labeled "Ground Floor". Row 438 of the spreadsheet has a Type of Folder, a name "First Floor" and a parent of "Oracle". This corresponds to the hierarchical level object 294 labeled "First Floor". Similarly, row 438 of the spreadsheet corresponds to the hierarchy level object 342 labeled "Reception". Row 440 of the spreadsheet corresponds to the hierarchy level object 344 labeled "Server Room". Row 442 of the spreadsheet corresponds to the hierarchy level object 346 labeled "Office Supplies". Row 444 of the spreadsheet corresponds to the hierarchy level object 348 labeled "Healthcare". Row 446 of the spreadsheet corresponds to the hierarchy level object 350 labeled "Elevator Area". Row 448 of the spreadsheet corresponds to the hierarchy level object 294 labeled "First Floor". It will be appreciated that similar corollaries may be made between the devices shown in FIG. 22 and those shown for example in FIG. 20. As an example, a device 450, with a name "Camera4" corresponds to the device 394 shown in FIG. 20. It can be seen that the illustrative spreadsheet even includes the tag "Elevator" that was assigned to the device 394.

FIG. 23 provides a screen 460 that shows an alternate way of creating a spatial hierarchy model. Much like the screen 420, the screen 460 may be displayed by any preferred spreadsheet software or the like. For this particular example, Microsoft Excel was used. The screen 460 includes a column 462 labeled "Space ID". This column simply increments by one each row, and provides a numerical identifier for that row and the hierarchical level object or device included in that particular row. A column 464 is labeled "Space Name" and provides a space for a name to be entered along with a "\" character that indicates a depth. Use of a single "I" character represents a higher level than use of two "I" characters. Use of three "/" characters represents a lower level than use of two "I" characters. This is merely illustrative, as any particular character may be selected or used to indicate relative depth. A column 466 labeled "Space Type" provides a space for a user to enter this information.

In the spatial hierarchy model shown on the screen 460, there are two regions, named "US EAST" and "US WEST", as indicated by these names having a single "I" character prefixing the name. There is a "ATLANTA" site within the US EAST region, and a "HONEYWELL MIDTOWN" building within the "ATLANTA" site. There is also a "NEW JERSEY" site within the "US EAST" region, with a "HONEYWELL NJ OFFICE" building within the "NEW JERSEY" site. Each of the sites has two "I" characters prefixing the site name, and each of the buildings has three "I" characters prefixing the building name. Similarly, the "US WEST" region includes a "SAN FRANCISCO" site with a "HONEYWELL SFD OFFICE" building within the "SAN FRANCISCO" site. The "US WEST" region also includes a "SAN DIEGO" site, but no buildings within the "SAN DIEGO" site have been entered yet.

Figure 24:
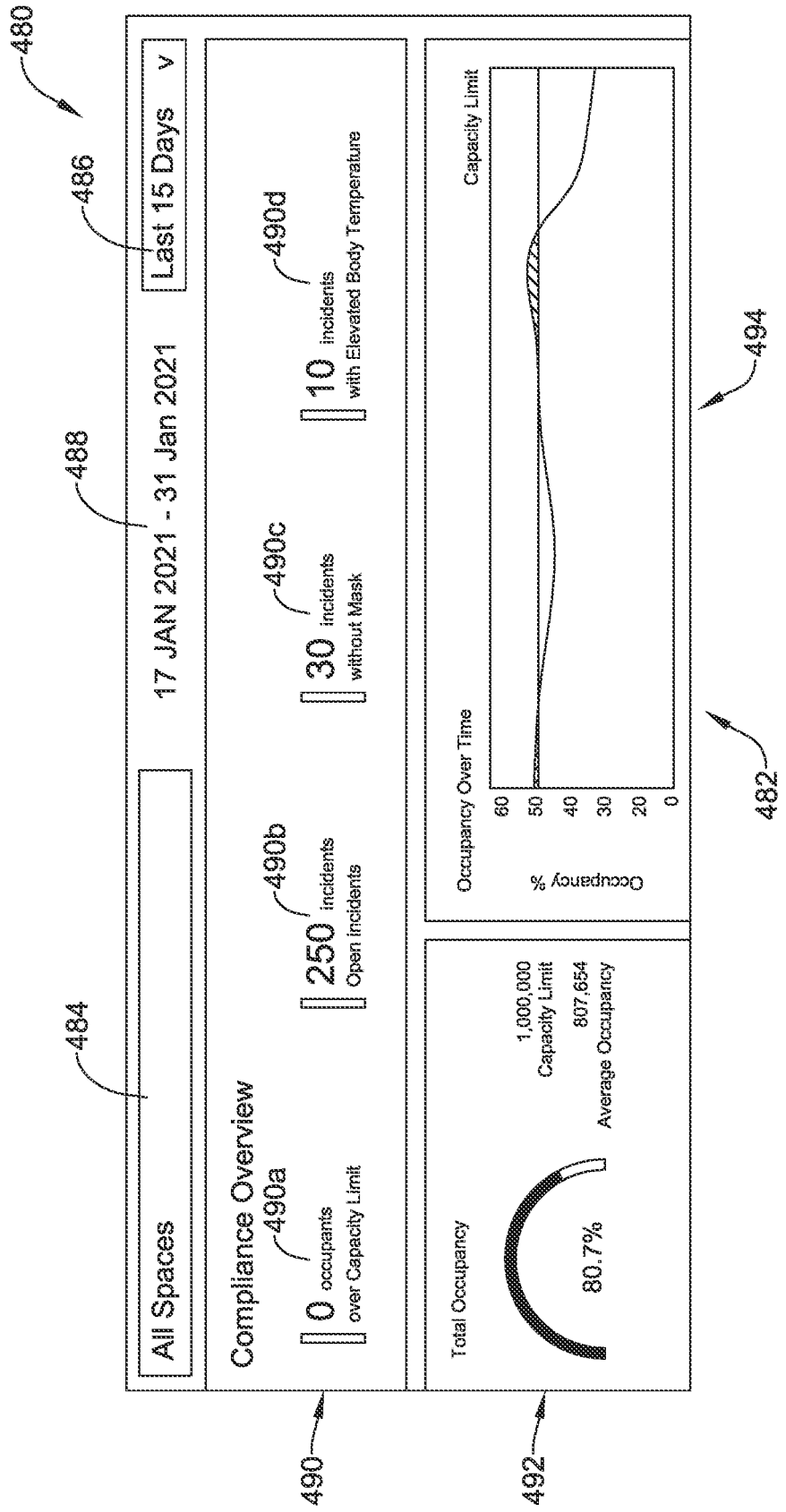
FIG. 24 is a screen shot showing an illustrative healthy building dashboard.

FIG. 24 is a screen shot providing a screen 480 that provides a healthy building dashboard 482. The dashboard 482 includes a hierarchy level indicator 484 that informs the user that the dashboard 482 is displaying aggregated data from a particular hierarchy level. It will be appreciated that for displaying aggregated data from a particular hierarchy level, this will include data from any and all child and grandchild hierarchal levels relative to that particular hierarchy level. In this particular example, the hierarchy level 484 reads "All Spaces". The dashboard 482 includes a time frame pull-down menu 486, which allows the user to display information for a desired time frame. The pull-down menu 486 may include any desired time frames to select from, such as "PAST 24 HOURS", "PAST WEEK", "PAST 15 DAYS", "PAST 30 DAYS", "PAST YEAR" and the like. In some cases, the pull-down menu 486 may instead provide a calendar that the user can select a starting point and an ending point from. The pull-down menu 486 may instead be a box in which the user can directly type in either a desired time frame, or specific starting and ending points. As illustrated, the pull-down menu 486 reads "LAST 15 DAYS". The dashboard 482 includes a date indicator 488 that provides the actual dates corresponding to the time-frame selected using the pull-down menu 486.

Because the hierarchal level indicator 484 reads "All Spaces", the aggregated data that is displayed within the dashboard 482 represents, for each particular healthy building criteria, a sum total of incidents relating to that particular healthy building criteria not only for the selected hierarchal level, but also for all child and grandchild hierarchal levels that are under the selected hierarchal level. For the sake of this example, assume that the spatial hierarchy model represented by the dashboard 482 is the same as that shown in FIG. 23.

The dashboard 482 includes a "COMPLIANCE OVERVIEW" section 490 that shows, for the selected hierarchal level (as indicated by the hierarchy level indicator 484), an aggregated total for each of the displayed healthy building criteria from the selected hierarchal level and all sub-levels. In this example, the COMPLIANCE OVERVIEW section 490 includes a CAPACITY indicator 490a, an INCIDENTS indicator 490b, a NO MASKS indicator 490c and an ELEVATED BODY TEMPERATURE indicator 490d. As indicated, in the last 15 days, in the time period "17 Jan. 2021-31 Jan. 2021", there have been no incidents with average capacity exceeding capacity limits, there are a total of 250 open incidents, there were 30 incidents of people not wearing masks and there were 10 incidents of people being detected having elevated body temperatures.

The dashboard 482 may also display additional detail. For example, the dashboard 482 provides a graphical representation 492 that indicates that during the selected time period, and for the selected hierarchal level, average occupancy has been 80.7 percent of capacity. In this, capacity may indicate a summation of the actual capacity limits for each of the included facilities, such as but not limited to the capacity limits that fire departments set for particular facilities. Capacity may alternatively indicate a reduced capacity figure, such as a 25 percent capacity or a 50 percent capacity as directed by infectious disease protocols. For example, many local governments have directed such reduced capacity figures during the COVID19 pandemic. The dashboard 482 may also include a graphical representation 494, over time, of actual occupancy values. While there have been several transient periods in which the actual occupancy exceeded a capacity limit, it can be seen that overall, the average occupancy has not. In some cases, the graphical representation 494 may use a different color, for example, to indicate when the actual occupancy has exceeded capacity.

Figure 25:
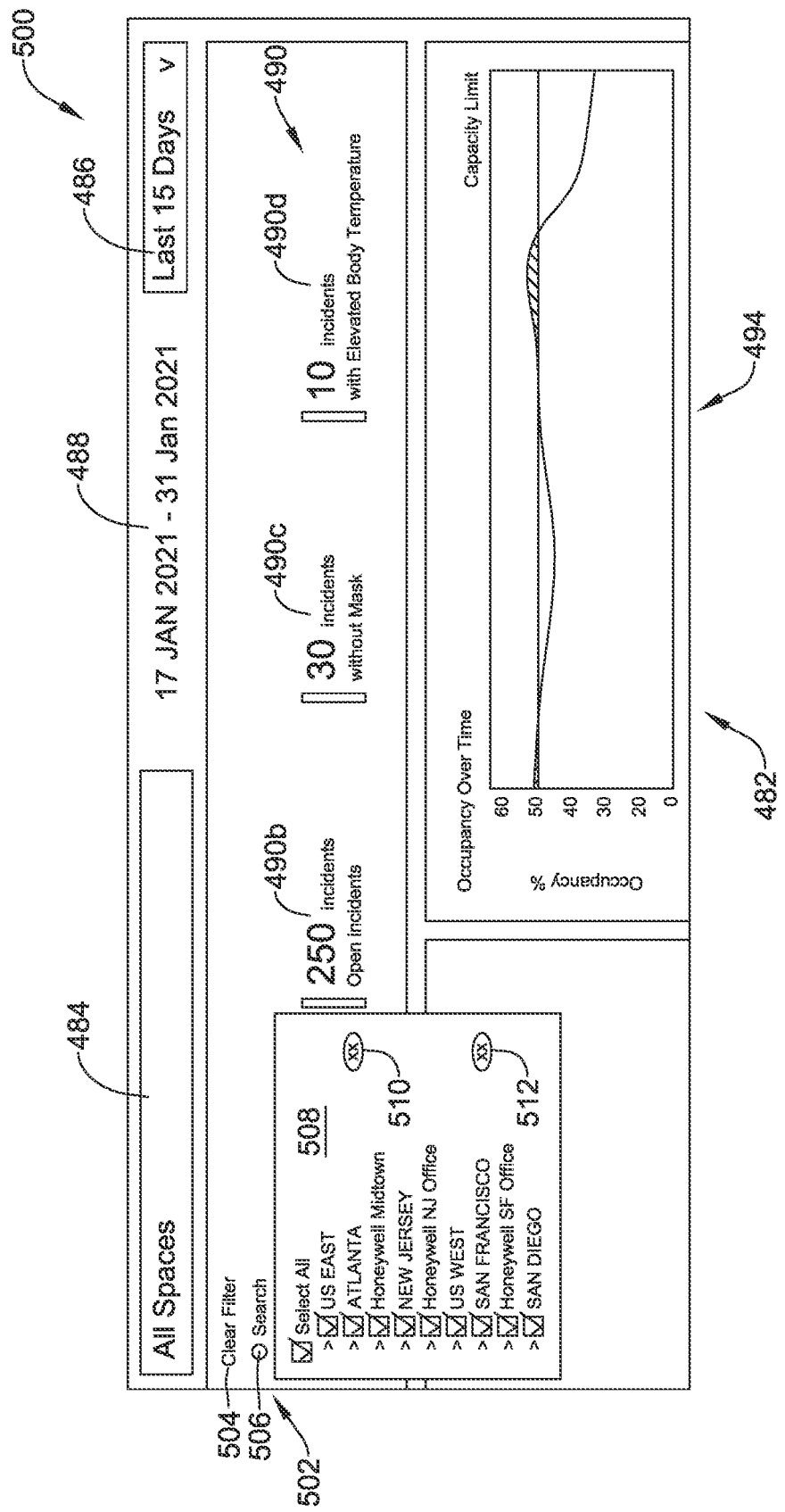
FIG. 25 is a screen shot showing an illustrative healthy building dashboard.

In some cases, selecting the hierarchy level indicator 484 may cause a screen 500 to be displayed, as seen in FIG. 25. The screen 500 includes the dashboard 482, although a pull-down menu 502 provides options for controlling what is displayed on the dashboard 482. The pull-down menu 502 includes a FILTER option 504 that can be used to filter what is displayed. The pull-down menu 502 includes a SEARCH option 506 that can be used to direct a search. The pull-down menu 502 also includes a spatial hierarchal model indicator 508. It will be appreciated that the spatial hierarchal model indicator 508 will typically be much larger than what is shown, and thus the spatial hierarchy model indicator 508 may include scroll-bars (not shown) that allow a user to move vertically within the spatial hierarchy model indicator 508. It will be appreciated that the spatial hierarchy model indicator 508 matches that shown in FIG. 23. As shown, the spatial hierarchy model indicator 508 also includes an indicator 510 displayed opposite the ATLANTA site and an indicator 512 that is displayed opposite the SAN FRANCISCO site. These indicators 510, 512, if displayed, may include a number displayed within the indicator 510, 512 that informs the user that these particular hierarchal levels may have a number of problems needing attention.

As seen, all of the boxes are checked, meaning that the aggregated data displayed within the dashboard 482 includes all data from the US EAST region and the US WEST region. The US EAST region includes the ATLANTA site, which itself includes the "Honeywell Midtown" building, and the NEW JERSEY site, which itself includes the "Honeywell NJ Office" building. The US WEST region includes the SAN FRANCISCO site, which itself includes the "Honeywell SF Office" building, and the SAN DIEGO site which does not yet have any buildings indicated.

If for example, the US EAST box was checked (instead of checking the "Select All" box), the ATLANTA site and the "Honeywell Midtown" buildings would also be checked as a matter of course. The aggregated data displayed on the dashboard 482 would only include data aggregated from each of the ATLANTA site and the "Honeywell Midtown" building. It will be appreciated that the ATLANTA site likely includes a plurality of buildings, but in this example only one building has been entered thus far. To continue the example, an occupancy sensor within the "Honeywell Midtown" building may provide a signal indicating that a particular room to which that occupancy sensor has been installed and assigned. That signal would indicate a potential problem for that particular room in the "Honeywell Midtown" building. That signal would also indicate a potential problem for the particular floor including that particular room, for example. The building may be further divided into areas or portions, and that signal would also indicate a problem within any area or portion that includes the particular room to which the particular sensor is assigned. That signal would also indicate a problem for the ATLANTA site and the US EAST region.

Occupancy data that might be displayed on the dashboard 482 if the US EAST box was checked would include, for the "Honeywell Midtown" building, an aggregation of signals from every occupancy sensor within the "Honeywell Midtown" building. Continuing the example, occupancy data that might be displayed on the dashboard 482 for the ATLANTA site would include the occupancy data from the "Honeywell Midtown" building as well as for any other buildings (not shown) that are within the ATLANTA site. Occupancy data that might be displayed on the dashboard 482 for the US EAST region would include the aggregated occupancy data for the ATLANTA site, the NEW JERSEY site and any other sites (not yet entered) that are assigned within the US EAST region.

Having thus described several illustrative embodiments of the present disclosure, those of skill in the art will readily appreciate that yet other embodiments may be made and used within the scope of the claims hereto attached. It will be understood, however, that this disclosure is, in many respects, only illustrative. Changes may be made in details, particularly in matters of shape, size, arrangement of parts, and exclusion and order of steps, without exceeding the scope of the disclosure. The disclosure's scope is, of course, defined in the language in which the appended claims are expressed.

What is claimed is:

1. A method of building a spatial hierarchical model of a plurality of building control assets, the spatial hierarchical model configured to provide spatial context of the plurality of building control assets in a building to an operator when the operator is monitoring and/or controlling the plurality of building control assets of the building, the method comprising:

accepting user input via one or more screens to add and name each of one or more first level spaces of the building at a first level of the spatial hierarchical model to build the spatial hierarchal model;

accepting user input via one or more screens to select a selected one of the first level spaces of the spatial hierarchical model and add and name each of one or more child level spaces of the building that are spatially part of the selected first level space of the building at a second level of the spatial hierarchical model to continue to build the spatial hierarchal model;

concurrently displaying together:
a graphical representation of at least part of the spatial hierarchal model as the spatial hierarchal model is being built; and
a listing of at least some of the plurality of building control assets that are available for the user to add to the spatial hierarchal model;

and accepting user input to assign one or more selected building control assets from the displayed listing of at least some of the plurality of building control assets to a selected child level space within the spatial hierarchal model that is concurrently displayed with the one or more selected building control assets.

2. The method of claim 1, further comprising:
deploying the spatial hierarchical model; and
monitoring and/or controlling at least some of the plurality of building control assets using the deployed spatial hierarchical model.

3. The method of claim 1, wherein accepting user input to assign one or more selected building control assets from the displayed listing of at least some of the plurality of building control assets to the selected child level space comprises dragging and dropping one or more selected building control assets from the displayed listing of at least some of the plurality of building control assets to the selected child level space that is concurrently displayed with the one or more selected building control assets.

4. The method of claim 1, wherein accepting user input via one or more screens to add and name each of one or more first level spaces at the first level of the spatial hierarchical model comprises:
accepting a selection of an add new space icon;

displaying a pop-up menu in response to the selection of the add new space icon; and accepting a name for at least one of the one or more first level spaces.

5. The method of claim 1, wherein accepting user input via one or more screens to select the selected one of the first level spaces of the spatial hierarchical model and add and name each of one or more child level spaces of the building that are spatially part of the selected first level space of the building at the second level of the spatial hierarchical model comprises:

accepting a selection of the selected one of the first level spaces;

accepting a selection of an add new space icon;

displaying a pop-up menu in response to the selection of the add new space icon; and accepting a name for at least one of the one or more child level spaces.

6. The method of claim 1, wherein the displayed listing of at least some of the plurality of building control assets comprises building control assets that are already connected and visible on a building control network that is to be monitored and/or controlled using the spatial hierarchical model.

7. The method of claim 1, wherein the plurality of building control assets comprise video cameras.

8. The method of claim 1, wherein the plurality of building control assets comprise Heating, Ventilation and/or Air Conditioning (HVAC) assets.

9. The method of claim 1, wherein displaying the listing of at least some of the plurality of building control assets comprises filtering the plurality of building control assets using filter criteria and displaying only the building control assets that meet the filter criteria.

10. The method of claim 1, further comprises displaying a visual indication of which of the plurality of building control assets have not been yet been assigned.

11. The method of claim 1, further comprising assigning a unique identifier to each of the one or more first level spaces, the one or more child level spaces and the one or more building control assets that are assigned to a child level space.

12. The method of claim 1, further comprising accepting user input via one or more screens to assign searchable tags to at least some of the first level spaces, child level spaces and/or assigned building control assets.

13. The method of claim 12, wherein the searchable tags allow a user to categorize and/or group at least some of the first level spaces, child level spaces and/or assigned building control assets.

14. A system for monitoring and/or controlling a plurality of building control assets of a building comprising:

an input/output operatively coupled to the plurality of building control assets;

a display;

one or more processors operatively coupled to the input/output and the display, the one or more processors configured to:

display one or more screens on the display that allow a user to add and name each of one or more first level spaces of the building at a first level of a spatial hierarchical model;

display one or more screens on the display that allow the user to select a selected one of the first level spaces of the spatial hierarchical model and add and name each of one or more child level spaces of the building that are spatially part of the selected first level space of the building at a second level of the spatial hierarchical model, where one or more of the screens includes an ADD MULTIPLE FOLDERS option that allows the user to efficiently add multiple child level spaces to the selected first level space of the building;

in response to the user selecting the ADD MULTIPLE FOLDERS option, displaying one or more additional screens on the display that are configured to receive a name entered by the user for each of a plurality of folders that each define a child level space of the selected first level space of the building, and adding each of the plurality of folders with the name entered by the user to the second level of the spatial hierarchical model under the selected first level space of the building;

display a graphical representation of one or more of the first level spaces and one or more corresponding child level spaces;

display a listing of at least some of the plurality of building control assets operatively coupled to the input/output;

accept user input to assign selected building control assets from the listing of at least some of the plurality of building control assets to a selected child level space; and accepting user input to monitor and/or control at least some of the plurality of building control assets using the spatial hierarchical model.

15. The system of claim 14, wherein accepting user input to assign selected building control assets from the listing of at least some of the plurality of building control assets to the selected child level space comprises dragging and dropping one or more selected building control assets from the listing of at least some of the plurality of building control assets to the selected child level space.

* * * * *